United States Patent
Kumar et al.

(10) Patent No.: US 12,531,220 B2
(45) Date of Patent: Jan. 20, 2026

(54) AUTOMATED FEEDFORWARD AND FEEDBACK SEQUENCE FOR PATTERNING CD CONTROL

(71) Applicant: Lam Research Corporation, Fremont, CA (US)

(72) Inventors: Ravi Kumar, Beaverton, OR (US); Pulkit Agarwal, Beaverton, OR (US); Michael Philip Roberts, Tigard, OR (US); Ramesh Chandrasekharan, Portland, OR (US); Adrien Lavoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 633 days.

(21) Appl. No.: 17/921,343

(22) PCT Filed: May 4, 2021

(86) PCT No.: PCT/US2021/030731
§ 371 (c)(1),
(2) Date: Oct. 25, 2022

(87) PCT Pub. No.: WO2021/231138
PCT Pub. Date: Nov. 18, 2021

(65) Prior Publication Data
US 2023/0170195 A1    Jun. 1, 2023

Related U.S. Application Data

(60) Provisional application No. 63/023,157, filed on May 11, 2020.

(51) Int. Cl.
*H01J 37/32* (2006.01)
*H01L 21/02* (2006.01)
(Continued)

(52) U.S. Cl.
CPC .... *H01J 37/3299* (2013.01); *H01J 37/32724* (2013.01); *H01J 37/32926* (2013.01);
(Continued)

(58) Field of Classification Search
None
See application file for complete search history.

(56) References Cited

U.S. PATENT DOCUMENTS

2015/0262836 A1    9/2015  Lu et al.
2016/0307769 A1    10/2016 Tseng et al.
(Continued)

OTHER PUBLICATIONS

ISR & Written Opinion PCT/US2021/030731, dated Aug. 20, 2021, 11 pages.
(Continued)

*Primary Examiner* — Roberts P Culbert
(74) *Attorney, Agent, or Firm* — PENILLA IP, APC

(57) ABSTRACT

A method for performing a feedback sequence for patterning CD control. The method including performing a series of process steps on a wafer to obtain a plurality of features, wherein a process step is performed under a process condition. The method including measuring a dimension of the plurality of features after performing the series of process steps. The method including determining a difference between the dimension that is measured and a target dimension for the plurality of features. The method including modifying the process condition for the process step based on the difference and a sensitivity factor for the plurality of features relating change in dimension and change in process condition.

32 Claims, 13 Drawing Sheets

(51) Int. Cl.
  *H01L 21/033* (2006.01)
  *H01L 21/311* (2006.01)
  *H01L 21/66* (2006.01)

(52) U.S. Cl.
  CPC ...... *H01L 21/0228* (2013.01); *H01L 21/0337* (2013.01); *H01L 21/31116* (2013.01); *H01L 21/31144* (2013.01); *H01L 22/20* (2013.01); *H01J 2237/3321* (2013.01); *H01J 2237/3323* (2013.01); *H01J 2237/3325* (2013.01); *H01J 2237/3341* (2013.01)

(56) References Cited

U.S. PATENT DOCUMENTS

| | | |
|---|---|---|
| 2018/0033622 A1 | 2/2018 | Swaminathan et al. |
| 2020/0002815 A1 | 1/2020 | Agarwal et al. |
| 2020/0035572 A1* | 1/2020 | Agarwal ............. H01L 21/0337 |
| 2021/0020440 A1* | 1/2021 | He ......................... H01L 22/12 |

OTHER PUBLICATIONS

Intl Prelim Report PCT/US2021/030731, dated Nov. 15, 2022, 6 pages.
Intl Preliminary Report & Written Opinion PCT/US2021/030731, dated Nov. 15, 2022, total 6 pages.

* cited by examiner

AUTOMATED FEEDFORWARD AND FEEDBACK SEQUENCE FOR PATTERNING CD CONTROL

CLAIM OF PRIORITY

This application is a national stage filing of and claims priority, under 35 U.S.C. § 371, to PCT/US2021/030731, filed on May 4, 2021, and titled "AUTOMATED FEEDFORWARD AND FEEDBACK SEQUENCE FOR PATTERNING CD CONTROL", which claims priority, under 35 U.S.C. § 119 (e), to U.S. Provisional Application No. 63/023,157 filed on May 11, 2020, and titled "AUTOMATED FEEDFORWARD AND FEEDBACK SEQUENCE FOR PATTERNING CD CONTROL", both of which are incorporated by reference herein in their entireties.

TECHNICAL FIELD

The present embodiments relate to semiconductor device fabrication.

BACKGROUND OF THE DISCLOSURE

Many modern semiconductor fabrication processes are performed in plasma process modules in which a substrate is held on a substrate holder when exposed to a plasma. These processes are performed to generate features. Ever decreasing sizes of feature dimensions can be achieved through advanced patterning techniques to include multiple etch and deposition process steps for advanced devices. In particular, multiple patterning steps involving larger dimensions can be used to obtain smaller features. These advanced patterning techniques also increase the density of the features on the substrate. For example, double patterning increases feature density by a factor of two, such that the density of features is twice as dense as the original.

Multi-patterning schemes enable continued scaling for leading-edge logic and memory devices, and require strict critical dimension (CD) and uniformity control across the wafer, and from wafer to wafer. As the number of process steps for these applications continues to grow, minimizing variability is increasingly important as each additional step contributes to overall variation. Critical dimensions of features are typically controlled using a manual trial and error process. However, this process is inefficient and time consuming, and cannot be used for in-process variations in dimensions and/or process steps. For example, trial and error processes have difficulty in accounting for variations in critical dimensions for an incoming photo-lithography substrate, and have difficulty in accounting for any changes to processes. Further, these trial and error processes have difficulty in accounting for non-uniformity in feature dimensions across a wafer.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure It is in this context that embodiments of the disclosure arise.

SUMMARY

The present embodiments relate to solving one or more problems found in the related art, and specifically to include automated feedforward and feedback control for a double patterning process performed on a substrate to manage variability introduced during each step of multi-patterning processes. For example, feedforward and/or feedback control can be used for localized fine tuning that minimizes variation across the substrate by correcting for the variabilities introduced in a step of a patterning process, and for correcting for incoming pattern non-uniformities. Several inventive embodiments of the present disclosure are described below.

Embodiments of the present disclosure include a method for establishing sensitivity factors used for controlling core critical dimensions associated with features formed in a double patterning process. The method includes performing a series of process steps on a first plurality of test wafers, each of the first plurality of test wafers forming a plurality of features, wherein a first process step in the series of process steps is performed under a first process condition, wherein the series of process steps includes at least one process step. The method includes performing the series of process steps on a second plurality of test wafers, each of the second plurality of test wafers forming the plurality of features, wherein the first process step is performed under a second process condition. The method includes measuring a first dimension of the plurality of features located on the first plurality of test wafers. The method includes measuring a second dimension of the plurality of features located on the second plurality of test wafers. The method includes determining a sensitivity factor for the plurality of features relating change in dimension and change in process condition.

Other embodiments of the present disclosure include a non-transitory computer-readable medium storing a computer program for performing a method for establishing sensitivity factors used for controlling core critical dimensions associated with features formed in a double pattering process. The non-transitory computer-readable medium includes program instructions for performing a series of process steps on a first plurality of test wafers, each of the first plurality of test wafers forming a plurality of features, wherein a first process step in the series of process steps is performed under a first process condition, wherein the series of process steps includes at least one process step. The non-transitory computer-readable medium includes program instructions for performing the series of process steps on a second plurality of test wafers, each of the second plurality of test wafers forming the plurality of features, wherein the first process step is performed under a second process condition. The non-transitory computer-readable medium includes program instructions for measuring a first dimension of the plurality of features located on the first plurality of test wafers. The non-transitory computer-readable medium includes program instructions for measuring a second dimension of the plurality of features located on the second plurality of test wafers. The non-transitory computer-readable medium includes program instructions for determining a sensitivity factor for the plurality of features relating change in dimension and change in process condition.

Still other embodiments of the present disclosure disclose a computer system including a processor and memory coupled to the processor and having stored therein instructions that, if executed by the computer system, cause the computer system to execute a method for establishing sensitivity factors used for controlling core critical dimensions associated with features formed in a double pattering process. The method includes performing a series of process steps on a first plurality of test wafers, each of the first plurality of test wafers forming a plurality of features, wherein a first process step in the series of process steps is performed under a first process condition, wherein the series of process steps includes at least one process step. The method includes performing the series of process steps on a second plurality of test wafers, each of the second plurality of test wafers forming the plurality of features, wherein the first process step is performed under a second process condition. The method includes measuring a first dimension of the plurality of features located on the first plurality of test wafers. The method includes measuring a second dimension of the plurality of features located on the second plurality of test wafers. The method includes determining a sensitivity factor for the plurality of features relating change in dimension and change in process condition.

Other embodiments of the present disclosure include a method for performing feedback to control core critical dimensions associated with features formed in a double patterning process. The method includes performing a series of process steps on a wafer to obtain a plurality of features, wherein a process step is performed under a process condition. The method includes measuring a dimension of the plurality of features after performing the series of process steps. The method includes determining a difference between the dimension that is measured and a target dimension for the plurality of features. The method includes modifying the process condition for the process step based on the difference and a sensitivity factor for the plurality of features relating change in dimension and change in process condition.

Other embodiments of the present disclosure include a non-transitory computer-readable medium storing a computer program for performing a method for performing feedback to control core critical dimensions associated with features formed in a double patterning process. The non-transitory computer-readable medium includes program instructions for performing a series of process steps on a wafer to obtain a plurality of features, wherein a process step is performed under a process condition. The non-transitory computer-readable medium includes program instructions for measuring a dimension of the plurality of features after performing the series of process steps. The non-transitory computer-readable medium includes program instructions for determining a difference between the dimension that is measured and a target dimension for the plurality of features. The non-transitory computer-readable medium includes program instructions for modifying the process condition for the process step based on the difference and a sensitivity factor for the plurality of features relating change in dimension and change in process condition.

Still other embodiments of the present disclosure disclose a computer system including a processor and memory coupled to the processor and having stored therein instructions that, if executed by the computer system, cause the computer system to execute a method for performing feedback to control core critical dimensions associated with features formed in a double patterning process. The method includes performing a series of process steps on a wafer to obtain a plurality of features, wherein a process step is performed under a process condition. The method includes measuring a dimension of the plurality of features after performing the series of process steps. The method includes determining a difference between the dimension that is measured and a target dimension for the plurality of features. The method includes modifying the process condition for the process step based on the difference and a sensitivity factor for the plurality of features relating change in dimension and change in process condition.

Other embodiments of the present disclosure include a method for performing feedforward to control core critical dimensions associated with features formed in a double patterning process. The method includes measuring an incoming ADI dimension of a mandrel on a wafer. The method includes determining a difference between an incoming ADI dimension and a desired ADI dimension of the mandrel. The method includes modifying a time for performing an etch process step based on the difference and an etch rate of the etch process step to achieve a desired ADT dimension of a core feature based on the incoming ADI dimension, the core feature being formed when performing a first patterning process of a self-aligned double patterning (SADP) process. The method includes receiving a change in a second patterning process of the SADP process. The method includes determining a modified ASD dimension for an oxide layer over the core feature based on the change in the second patterning process. The method includes determining a number of deposition cycles when performing an atomic layer deposition (ALD) process to achieve the modified ASD dimension based on a deposition rate of the ALD process and the desired ADT dimension of the core feature.

Other embodiments of the present disclosure include a non-transitory computer-readable medium storing a computer program for performing a method for performing feedforward to control core critical dimensions associated with features formed in a double patterning process. The non-transitory computer-readable medium includes program instructions for measuring an incoming ADI dimension of a mandrel on a wafer. The non-transitory computer-readable medium includes program instructions for determining a difference between an incoming ADI dimension and a desired ADI dimension of the mandrel. The non-transitory computer-readable medium includes program instructions for modifying a time for performing an etch process step based on the difference and an etch rate of the etch process step to achieve a desired ADT dimension of a core feature based on the incoming ADI dimension, the core feature being formed when performing a first patterning process of a self-aligned double patterning (SADP) process. The non-transitory computer-readable medium includes program instructions for receiving a change in a second patterning process of the SADP process. The non-transitory computer-readable medium includes program instructions for determining a modified ASD dimension for an oxide layer over the core feature based on the change in the second patterning process. The non-transitory computer-readable medium includes program instructions for determining a number of deposition cycles when performing an atomic layer deposition (ALD) process to achieve the modified ASD dimension based on a deposition rate of the ALD process and the desired ADT dimension of the core feature.

Still other embodiments of the present disclosure disclose a computer system including a processor and memory coupled to the processor and having stored therein instructions that, if executed by the computer system, cause the computer system to execute a method for performing feedforward to control core critical dimensions associated with features formed in a double patterning process. The method includes measuring an incoming ADI dimension of a mandrel on a wafer. The method includes determining a difference between an incoming ADI dimension and a desired ADI dimension of the mandrel. The method includes modifying a time for performing an etch process step based on the difference and an etch rate of the etch process step to achieve a desired ADT dimension of a core feature based on the incoming ADI dimension, the core feature being formed when performing a first patterning process of a self-aligned double patterning (SADP) process. The method includes receiving a change in a second patterning process of the SADP process. The method includes determining a modified ASD dimension for an oxide layer over the core feature based on the change in the second patterning process. The method includes determining a number of deposition cycles when performing an atomic layer deposition (ALD) process to achieve the modified ASD dimension based on a deposition rate of the ALD process and the desired ADT dimension of the core feature.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

DETAILED DESCRIPTION

Figure 1A:
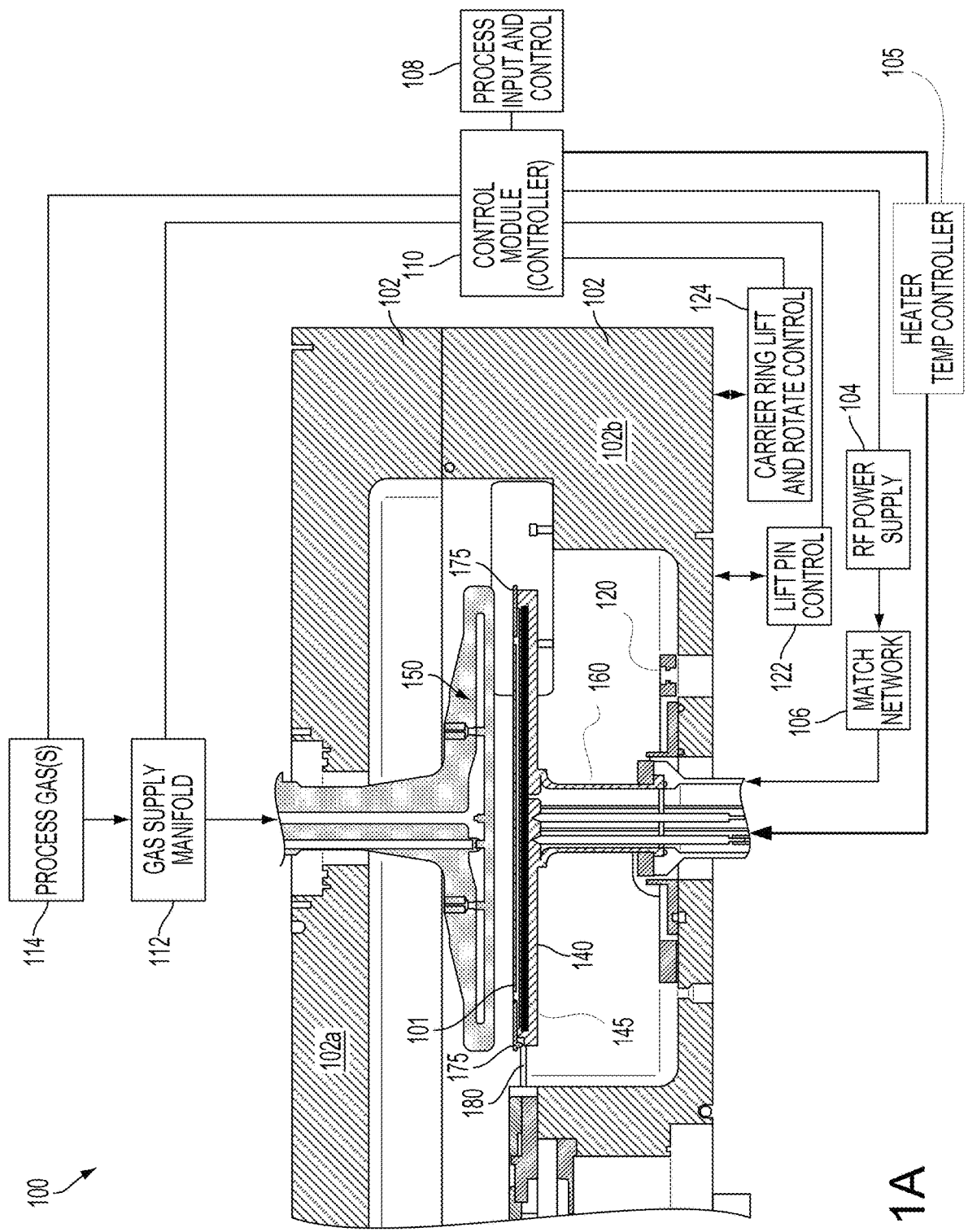
FIG. 1A illustrates a substrate processing system, which is used to process a wafer, e.g., to form films thereon, in accordance with one embodiment of the present disclosure.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe systems and methods that provide for automated feedforward and/or feedback control for a double patterning process performed on a substrate to manage variability introduced during each step of multi-patterning processes. Also, the feedforward and/or feedback control includes a mathematical framework for performing automation of the control sequences. Further, embodiments of the present disclosure include a transient solver for implementing the mathematical framework. For example, instead of manually performing feedforward and feedback control, automated feedforward and/or feedback control can be used for localized fine tuning that minimizes variation across the substrate by correcting for the variabilities introduced in a step of a patterning process, and for correcting for incoming pattern non-uniformities, in embodiments of the present disclosure. For example, automated feedforward and/or feedback control are important for double-patterning processes to account for any changes in incoming photo-CD (critical dimensions), or any variations down the line for dry etch. As a result, automated feedforward and/or feedback control improves green-to-green time for any changes in pre-steps or post-steps involving multi-patterning processes. As a result of automation, feedforward and/or feedback control can be used to minimize any variations in CD and CDNU (critical dimension non-uniformity), and saves added costs of reiterations, and gives the flexibility to make process changes when performing patterning processes.

Implementing automated and/or feedback control is described using a double patterning process throughout the specification, but it is understood that the techniques described herein for automated and/or feedback control can be used in any multi patterning process, such as quadruple patterning processes, etc.

Embodiments of the present disclosure relate to plasma process modules, such as those used in plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, a plasma enhanced chemical vapor deposition (PECVD) chamber or module, an atomic layer etch (ALE) chamber or module, an ion implantation chamber or module, a track chamber or module, and any other semiconductor processing systems that may be associated or used in the fabrication and/or manufacturing of semiconductor wafers to include processes such as electroplating, electroetching, electropolishing, electro chemical mechanical polishing, deposition, wet deposition, and through silicon via (TSV) processes. Further, embodiments of the present disclosure are not limited to the examples provided herein, and may be practiced in different plasma processing systems employing different configurations, geometries, and plasma-generating technologies (e.g., inductively coupled systems, capacitively coupled systems, electron-cyclotron resonance systems, microwave systems, etc.). Examples of plasma processing systems and plasma process modules are disclosed in commonly owned U.S. Pat. Nos. 8,862,855, and 8,847,495, and 8,485,128, and U.S. patent application Ser. No. 15/369,110, all of which are incorporated by reference in their entireties. The plasma process modules of embodiments of the present disclosure include pedestal, configured with or without an electrostatic chuck (ESC), configured for supporting a substrate, wherein the pedestal and/or ESC may include one or more heater zones used for transferring heat to a substrate when performing processes. In general, heating assemblies may include a showerhead, an ESC, a support chuck, a pedestal, chamber components, or other structures or components that may be implemented in reactors, chambers, process modules, etc. used for processing substrates.

Throughout the specification, the term "substrate" as used herein refers to a semiconductor wafer in embodiments of the present disclosure. However, it should be understood that in other embodiments, the term substrate can refer to substrates formed of sapphire, GaN, GaAs or SiC, or other substrate materials, and can include glass panels/substrates, metal foils, metal sheets, polymer materials, or the like. Also, in various embodiments, the substrate as referred to herein may vary in form, shape, and/or size. For example, in some embodiments, the substrate as referred to herein may correspond to a 200 mm (millimeters) semiconductor wafer, a 300 mm semiconductor wafer, or a 450 mm semiconductor wafer. Also, in some embodiments, the substrate as referred to herein may correspond to a non-circular substrate, such as a rectangular substrate for a flat panel display, or the like, and may include other shapes.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

FIG. 1A illustrates a reactor system 100, which may be used to deposit films over substrates, such as those formed in multi-patterning processes, including wet (e.g., chemical) and dry (e.g., plasma) etch and deposition processes, such as atomic layer deposition (ALD) processes. These reactors may utilize one or more heaters, and the common terminal configurations may be used in this example reactor to control the temperatures for uniformity or custom settings. More particularly, FIG. 1A illustrates a substrate processing system 100, which is used to process a wafer 101. The system includes a chamber 102 having a lower chamber portion 102b and an upper chamber portion 102a. A center column 160 is configured to support a pedestal 140, which in one embodiment is a powered electrode. The pedestal 140 is electrically coupled to RF power supply 104 via a match network 106. The RF power supply 104 is controlled by a control module 110, e.g., a controller. The control module 110 is configured to operate the substrate processing system 100 by executing process input and control 108. The process input and control 108 may include process recipes, such as power levels, timing parameters, process gasses, mechanical movement of the wafer 101, etc., such as to deposit or form films over the wafer 101.

Embodiments of the present disclosure include a pedestal 140 with or without an electrostatic chuck (ESC) 145 that is configured to hold a substrate 101 while being exposed to a plasma processing environment in which plasma is generated. The pedestal 140 and/or ESC 145 may include one or more heater zones that are individually controllable when performing processing operations within the reactor system 100, as will be further described in FIG. 1B.

The center column 160 also includes lift pins (not shown), each of which is actuated by a corresponding lift pin actuation ring 120 as controlled by lift pin control 122. The lift pins are used to raise the wafer 101 from the pedestal 140 to allow an end-effector to pick the wafer and to lower the wafer 101 after being placed by the end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112, the chamber pressure, the generation of RF power from one or more RF power sources, the exhaust pump, etc. The chosen gases are then flown into the shower head 150 and distributed in a space volume defined between the showerhead 150 face that faces that wafer 101 and the wafer 101 resting over the pedestal 140. In ALD processes, the gases can be reactants chosen for absorption or reaction with absorbed reactants.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 175 that encircles an outer region of the pedestal 140. The carrier ring 175 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 175 is lifted by spider forks 180. The carrier ring 175 is therefore lifted along with the wafer 101 and can be rotated to another station, e.g., in a multi-station system. In other embodiments, the chamber is a single station chamber.

Further, a heater temperature controller 105 is configured to control temperature of one or more heater zones of the pedestal 140 configured with or without ESC 145, wherein the heater zones may be located within the pedestal and/or the ESC. The heater zones are used to enable precision control of the surface temperature of the pedestal 140, with or without ESC 145, during processing of a substrate. Multiple heater zones that are controllable provide the ability to tune a temperature profile of the pedestal 140, with or without an ESC 145, (e.g., radial profile, azimuthal profile, etc.) to compensate for variability introduced during steps of multi-patterning processes. For example, variability may be caused by varying environmental conditions (e.g., thermal loss conditions, heat transfer conditions that vary between different process steps, etc.). It is understood that controlling temperatures of one or more heater zones of the pedestal 140, configured with or without an ESC 145, may be performed by the heater controller 105 and the controller 110, each taken alone or in combination.

Figure 1B:
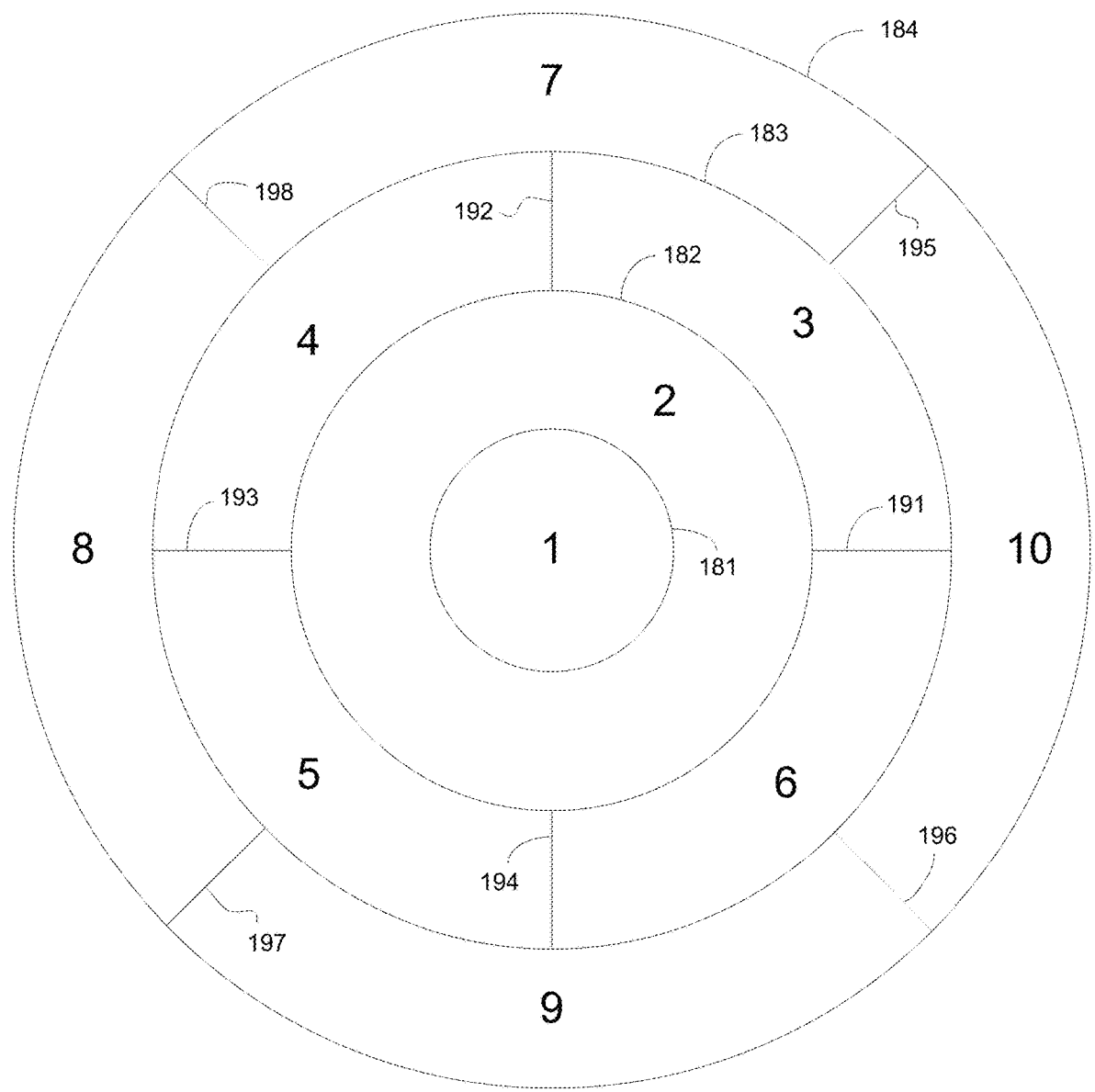
FIG. 1B illustrates an electrostatic chuck including a plurality of heater zones, wherein each heater zone is individually controllable for providing heat, in accordance with one embodiment of the disclosure.

FIG. 1B illustrates an pedestal 140A configured as a multi-zone heating system including a plurality of heater zones, wherein each heater zone is individually controllable for providing heat, in accordance with one embodiment of the disclosure. A top surface of the pedestal 140A may include an area configured to support the substrate 101 during processing. In another embodiment, the heater zones may be configured within an ESC that may be the topmost layer of the pedestal 140, wherein the ESC may include a base plate, a bond layer disposed over the base plate, and a ceramic layer disposed over the bond layer. For purposes of ease and clarity, the following describes heater zones within a pedestal, but it is understood that the heater zones may be located within the pedestal and/or the ESC in various embodiments.

For purposes of illustration, each heater zone in pedestal 140A, configured with or without an ESC, may be heated by one or more heater traces (e.g., resistive element) as controlled by heater controller 105 and/or controller 110, in one embodiment. For example, each of the heater zones may include a heater trace (e.g., resistive element) electrically coupled to a controller for controlling the power supplied the corresponding heater trace (e.g., power supplied through a corresponding heater power supply—not shown). Each of the heater traces may be integrated in or embedded within a corresponding heater zone, and is configured to provide heat to the corresponding heater zone. For example, the heater traces may be fabricated and formed inside one of the layers of the pedestal 140A and/or ESC, such that the heater traces are disposed inside of the layer. As such, heat generated by the heater traces may be transferred to the layer of the pedestal 140A and/or ESC, and further transferred to the surface of the pedestal 140A, configured with or without an ESC.

It should be appreciated that the multi-zone heating system of pedestal 140A, configured with or without an ESC, shown in FIG. 1B is only one example, and various layout configurations can be supported. For example, layout configurations (e.g., grid patterns) of heater zones may be symmetric, asymmetric, uniformly distributed across the grid pattern, non-uniformly distributed across the grid pattern, of various shapes fitting within the outline of the pedestal 140A, configured with or without an ESC, etc. For example, a heating system having one or more heater zones can be provided, such as a three heater zone system including an inner zone, a middle zone, and an outer zone. The number of heater zones may vary between systems, to include as examples heater zones numbering between 1 to 5, or to include heater zones numbering between 5 to 10, or 5 to 15, or greater than 5 heater zones, or greater than 10 heater zones, or greater than 20 heater zones, or greater than 50 heater zones, or greater than 75 heater zones, or greater than 100 heater zones, or greater than 125 heater zones, or greater than 150 heater zones. In still other examples, heater zones may be grouped in layers, wherein one set of multiple heater zones is at one horizontal layer, and at least one other layer includes another set of multiple heater zones. In other embodiments, the heater zones can be oriented in various configurations, such as in pie shapes, circular oriented heating circles, a grid of individual resistive elements, zigzag resistive elements, single resistive element, etc. As an illustration of embodiments, some layout configurations may provide for continuous circular rings of resistive elements for the multiple zones.

Purely for illustration, pedestal 140A, configured with or without an ESC, includes ten heater zones 1 through 10. The heater zones may be defined by radial and/or azimuthal parameters. For example, pedestal 140A may be partitioned by one or more radii, including radius 181, radius 182, radius 183 and radius 184. In addition, pedestal 140A may be partitioned by one or more azimuths, including azimuths 191-198. As shown in FIG. 1B, zone 1 is a radial zone, and is located at radii at or below radius 181. Zone 2 is also a radial zone, and is located between radius 181 and 182. Zones 3-6 are located within the radial zone defined by radius 182 and 183, each between different azimuths. For example, within the radial zone defined above, zone 3 is located between azimuths 191 and 192, zone 4 is located between azimuths 192 and 193, zone 5 is located between azimuths 193 and 195, and zone 6 is located between azimuths 191 and 194. Further, zones 7-10 are located within the radial zone defined by radius 183 and radius 184, each between different azimuths. For example, within the radial zone defined above, zone 7 is located between azimuths 195 and 198, zone 8 is located between azimuths 197 and 198, zone 9 is located between azimuths 196 and 197, and zone 10 is located between azimuths 195 and 196.

In one embodiment, a multi-zone heating system is provided in one layer of the pedestal 140A, configured with or without an ESC, wherein the zones are arranged in a one or more grid patterns. Each of the elements in the grid is individually controllable to provide heat. The multi-zone heating system provided in one layer of the pedestal 140A, with or without ESC, may be configured to provide for fine tuning of heat across the pedestal 140A. In another embodiment, the heating system may be distributed across multiple layers of the pedestal 140A, with or without an ESC. For example, one layer may provide for fine tuning of the heat provided to the pedestal 140A. The fine tuning of heat may be provided through the grid pattern of heating elements and/or heating zones described above for a multi-zone heating system. The heating system may include another layer of one or more heating zones that are configured to provide coarse tuning of heat applied to the pedestal 140A, configured with or without an ESC. For example, coarse tuning may be implemented by one or more rings of heater zones may be provided across the pedestal 140A, configured with or without an ESC, such as a dual heater zone pedestal 140A (e.g., two heater zones), a tri heater zone pedestal 140A (e.g., three heater zones), or a quad heater zone pedestal 140A (e.g., four heater zones), etc.

Figure 2:
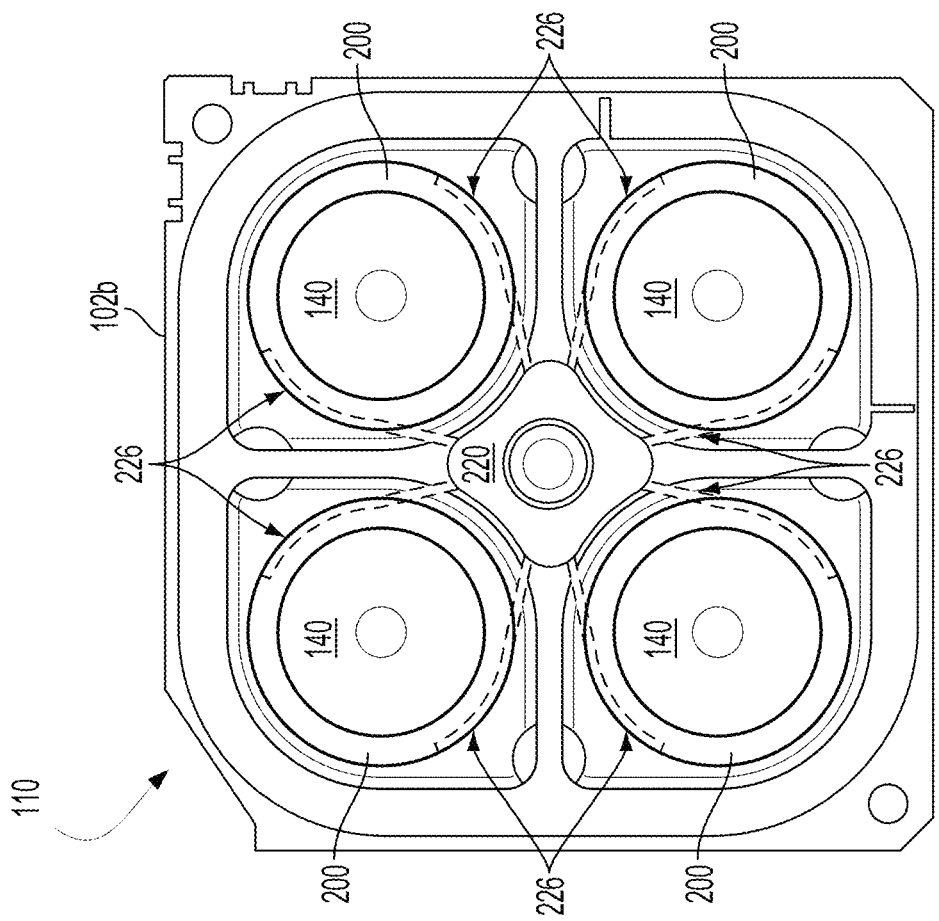
FIG. 2 illustrates a top view of a multi-station processing tool and/or process module, wherein four processing stations are provided, in accordance with one embodiment.

FIG. 2 illustrates a top view of a multi-station processing tool or process module 110, wherein four processing stations are provided. This top view is of the lower chamber portion 102b (e.g., with a top chamber portion removed for illustration), wherein four stations are accessed by spider forks 226. Each spider fork, or fork includes a first and second arm, each of which is positioned around a portion of each side of a pedestal 140. In this view, the spider forks 226 are drawn in dash-lines, to convey that they are below a carrier ring 200. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101.

Figure 3:
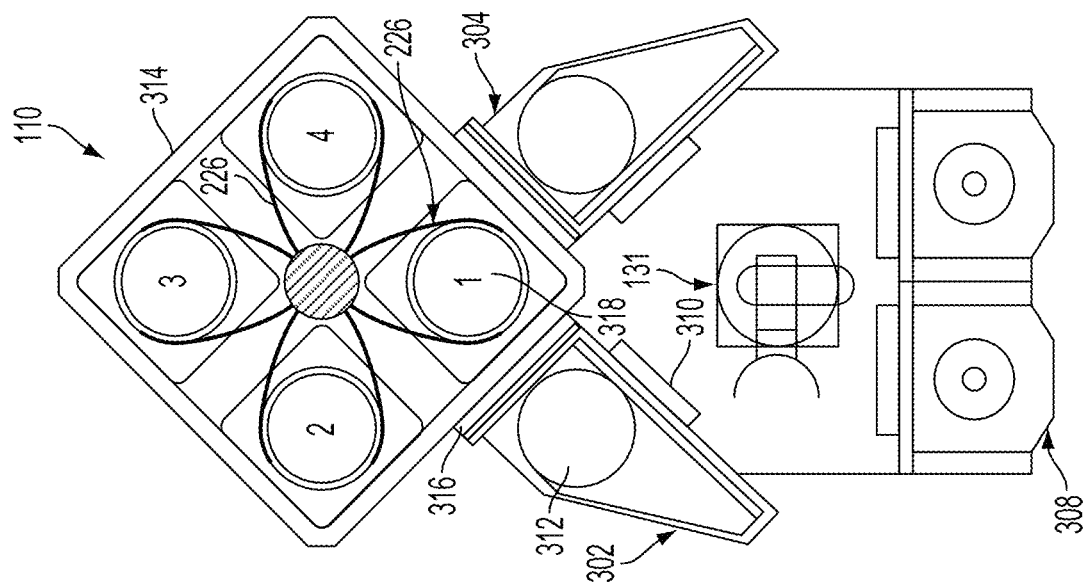
FIG. 3 shows a schematic view of an embodiment of a multi-station processing tool with an inbound load lock and an outbound load lock, in accordance with one embodiment.

FIG. 3 shows a schematic view of an embodiment of a multi-station processing tool or process module 110 with an inbound load lock 302 and an outbound load lock 304. A robot 131, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102b. Thus, when chamber transport 316 is opened, another robot (not shown, such as robot 312 of a vacuum transfer module 190) may move the substrate from inbound load lock 302 to a pedestal 140 of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier ring 200 among the process stations without experiencing a vacuum break and/or air exposure. Each process station depicted in FIG. 3 includes a process station substrate holder (shown at 318 for station 1) and process gas delivery line inlets.

FIG. 3 also depicts spider forks 226 for transferring substrates within processing chamber 102b. The spider forks 226 rotate and enable transfer of wafers from one station to another. The transfer occurs by enabling the spider forks 226 to lift carrier rings 200 from an outer undersurface, which lifts the wafer, and rotates the wafer and carrier together to the next station. In one configuration, the spider forks 226 are made from a ceramic material to withstand high levels of heat during processing.

In semiconductor wafer ("wafer" hereafter) fabrication, a layer of a core material can be deposited on the wafer and patterned for use as a mask in processing one or more underlying materials on/within the wafer. In various embodiments, the wafer may vary in form, shape, and/or size. For example, in some embodiments, the wafer referred to herein may correspond to a 200 mm (millimeter) diameter semiconductor wafer, a 300 mm diameter semiconductor wafer, or a 450 mm diameter semiconductor wafer. Also, in some embodiments, the wafer referred to herein may have a non-circular shape, such as a rectangular substrate for a flat panel display, or the like, among other shapes.

Figure 4A:
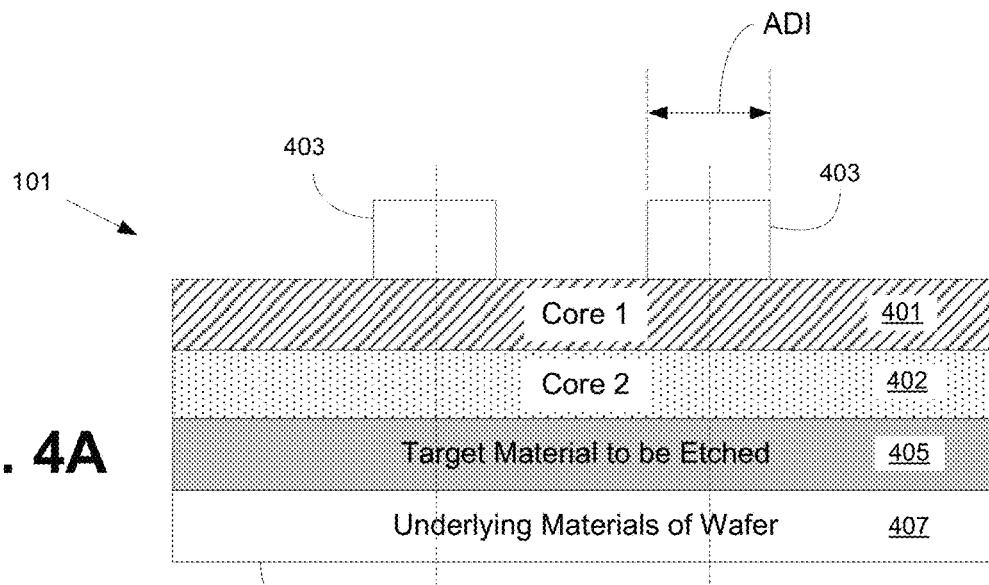
FIGS. 4A-4H show diagrams of vertical cross-sections through a portion of a wafer undergoing a number of operations and or processes when performing self-aligned double patterning (SADP) processes, in accordance with one embodiment of the disclosure.
Figure 4B:
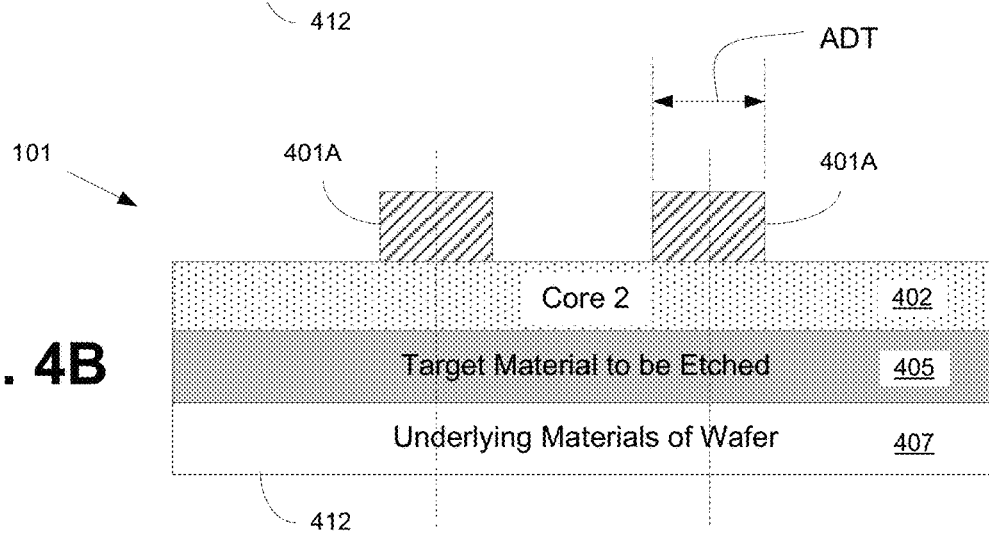
Figure 4C:
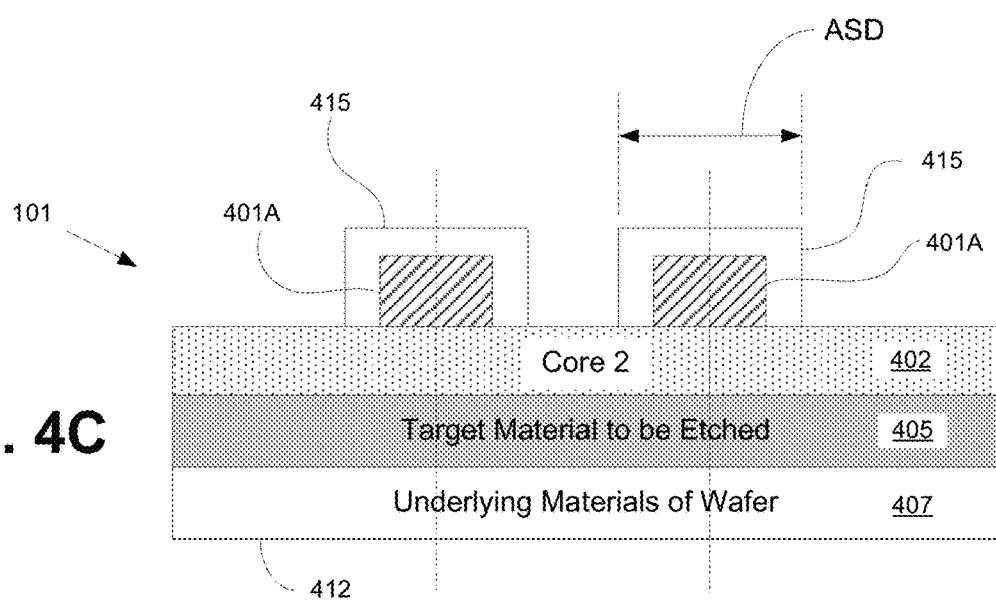

The layer of core material is exposed to a pattern of light transmitted through a reticle and onto the wafer in a photolithography process so that core material can be developed into a prescribed pattern of features, where some of the core features have a critical dimension. The critical dimension in this context refers a smallest dimension that is to be controlled in the particular fabrication process. The critical dimension of core features is controlled by the capabilities of the photolithography process that is used to pattern the layer of core material. There is a limit to how much the critical dimension of core features can be reduced using standard photolithography processes, e.g., using photolithography based on 193 nanometer light. Attempting to create core features that have too small of a critical dimension can cause problems in patterning the layer of core material using standard photolithography processes. Therefore, the standard photolithography processes effectively limit how small the critical dimension of core features can be made. However, once core features are formed at the smallest critical dimension that the photolithography process can accurately provide, it is possible to use the core features to fabricate even smaller critical dimension features by performing a series of etching processes to create masks that have features based on the photolithography-patterned core features. Such etching processes include self-aligned multiple patterning (SAMP) processes, and can include self-aligned double patterning (SADP) processes and self-aligned quadruple patterning (SAQP) processes, among others FIGS. 4A-4H show diagrams of a vertical cross-section through a portion of a wafer 101 undergoing a number of operations in SADP processes, in accordance with some embodiments. FIGS. 4A-4C shows first patterning and FIGS. 4D-4H show the second patterning in a SADP processes, wherein each of the patterning processes may be performed in different chambers.

FIG. 4A. shows a diagram of the vertical cross-section through a portion of a wafer 101 in which photo-lithography is performed to form one or more photoresist (PR) mandrels 403. In particular, a layer of a target material 405 to be etched is deposited over wafer 101, i.e., over underlying materials 407 of the wafer 101. One or more core material layers may be formed over the underlying materials 107, such as core 1 layer 401 and core 2 layer 402.

A photoresist (PR) layer may be applied to the core 2 layer 402, such as through a spin coating process. The photoresist layer is exposed to light (e.g., ultraviolet light) or other exposing radiation through a photo-mask, which exposes some photoresist to the light. Lithography is performed so that unprotected photoresist may be etched. As shown, the photoresist is developed and exposed photoresist removed, thereby revealing a pattern of PR mandrels 403 formed on core 1 layer 401. In various embodiments, the PR mandrels 403 defining features can be formed of a photoresist material or a carbon material, such as spin-on carbon, chemical vapor deposition (CVD) carbon, plasma enabled chemical vapor deposition (PECVD) carbon, or flowable carbon mixture, among others. The PR mandrels 403 each have a critical dimension ADI as measured in a horizontal direction substantially parallel to a bottom surface 412 of the wafer 101. In some contexts, the patterned PR mandrel 403 can be referred to as a core mandrel, or incoming PR mandrel that is introduced into the chamber for etching and deposition processes. In some embodiments, the critical dimension ADI of the PR mandrels 403 can be fabricated at the smallest size that the photolithography process can accurately provide.

FIG. 4B illustrates the transfer of the mask to the underlying core 1 layer 401 using the pattern of PR mandrels 403. In particular, etching may be performed, such that areas of the core 1 layer 401 that are not protected by the PR mandrels 403 can be etched isotropically. Etching may be performed using wet chemicals (e.g., acids in a wet etch process). During the etching process, the core 1 layer 401 may also be laterally trimmed to reveal the core 1 features 401A having a critical dimension ADT, as measured in a horizontal direction substantially parallel to bottom surface 412 of wafer 101. The critical dimension ADT of the core 1 features 401A may be equal to or smaller than critical dimension ADI of the PR mandrels 403 (i.e., ADT=ADI or ADT<ADI). When the etching is complete, the photoresist in the PR mandrels 403 may be stripped, thereby revealing the core 1 features 401A in the desired mask pattern.

In FIG. 4C, the first patterning in the SADP processes continues with a conformal deposition of a mask material (e.g., oxide material) or spacer 1 DEP 415 over the core 1 features 401. In some embodiments, the mask material is deposited using an atomic layer deposition process. The mask material may be selectively etched, such that the oxide layer conforms to core 1 features 401A as spacer 1 DEP 415, and mask material may be removed between core 1 features 401 with some spacing to reveal the core 2 layer 402. The conformal spacer 1 DEP 415 is defined by a critical dimension ASD, as measured in a horizontal direction substantially parallel to bottom surface 412 of wafer 101.

Figure 4D:
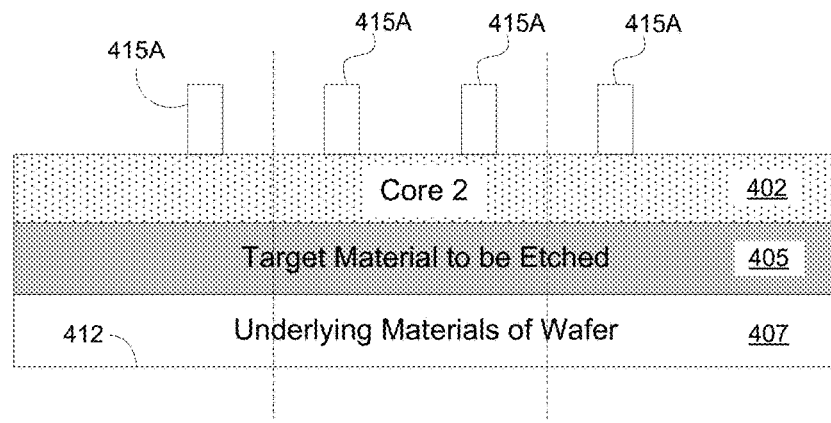

In FIG. 4D, the first patterning process continues (e.g., in second patterning processes) with a plasma etching process in which the top portions of the spacer 1 DEP 415 is selectively etched to reveal the core 1 features 401A, which are subsequently etched (e.g., core 1 layer 401 pull). In some embodiments, the plasma etching process is performed in a separate chamber. The plasma etching process for removing the top portion of the mask material 415 and the core 1 features 401A can be an isotropic or anisotropic etching process. As shown, side-spacers 415A of the spacer 1 DEP 415 remain on the wafer 101, and are used as a mask to plasma etch features into the core 2 layer 402. In some embodiments, side-spacers 415A are square spacers.

Figure 4E:
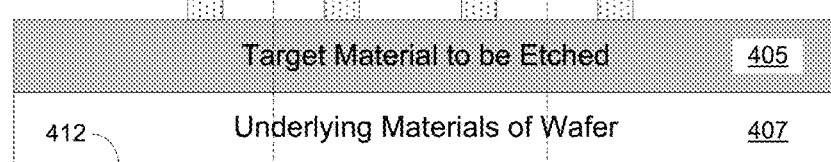

FIG. 4E illustrates the transfer of the mask formed with the pattern of side spacers 415A (formed with material of core 1 layer 401) to the underlying core 2 layer 402. In particular, etching may be performed, such that areas of the core 2 layer 402 that are not protected by the side spacers 415A can be etched isotropically. Also, the core 2 layer may be laterally trimmed during the etching process. In addition, the side spacers 415A may also be selectively etched. Etching may be performed using a dry etch process (e.g., in a dry plasma environment) in an anisotropic manner (e.g., top-down etching). As shown, core 2 features 402A that may be trimmed remain on the wafer 101.

Figure 4F:
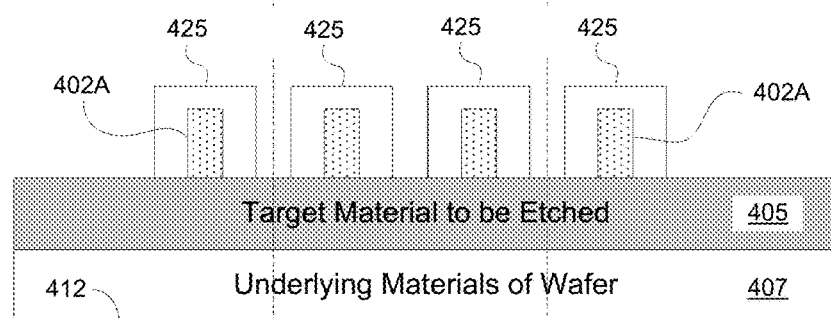

FIG. 4F, the second patterning in the SADP processes continues with a conformal deposition of spacer 2 DEP 425 (e.g., oxide material) over the core 2 features 402A. In some embodiments, oxide material deposition layer is deposited using an atomic layer deposition process. The deposition layer may be selectively etched, such that the oxide layer conforms to core 2 features 402A as spacer 2 DEP 425.

Figure 4G:
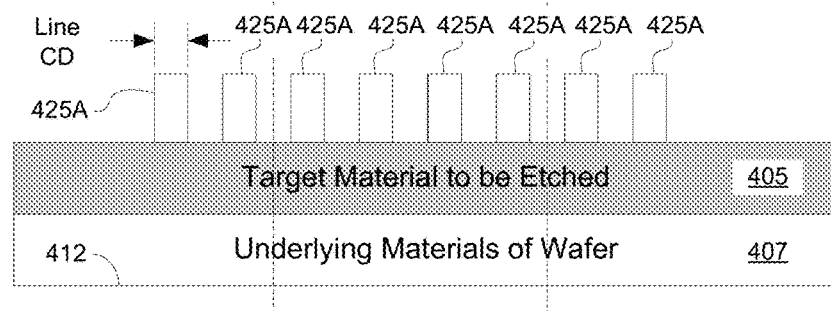

In FIG. 4G, the second patterning process continues (e.g., in second patterning processes) with a plasma etching process in which the top portions of the spacer 2 DEP 425 is selectively etched to reveal the core 2 features 402A, which also may be etched and trimmed (e.g., core 2 pull). The plasma etching process for removing the top portion of spacer 2 Dep 425 and the core 2 features 402A can be an isotropic or anisotropic etching process defined to remove materials. As shown, side-spacers 425A of the spacer 2 DEP 425 remain on the wafer 101, and are used as a mask to plasma etch features into the target material 405.

Figure 4H:
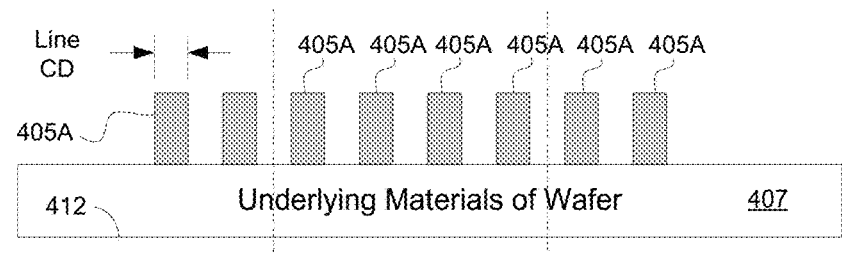

FIG. 4H shows a diagram of the vertical cross-section through the portion of the wafer 101 following a final plasma etching process to form final features 405A, and illustrates the transfer of the mask formed with the pattern of side spacers 425A (formed with material of core 2 layer 402) to the underlying target material 405. In particular, etching may be performed, such that areas of the target material 405 that are not protected by the side spacers 425A can be etched isotropically. Also, the target material 405 may be laterally trimmed during the etching process. In addition, the side spacers 425A may also be selectively etched. Etching may be performed using a dry etch process (e.g., in a dry plasma environment) in an isotropic or anisotropic manner (e.g., top-down etching). As shown, final features 405A remain on the wafer 101.

The critical dimension of the final features 405A may be defined by a line width or "line CD" that is measured in a horizontal direction substantially parallel to bottom surface 412 of wafer 101. The spacing between the final features 405A is dependent on multiple factors. For example, variation in spacing between different final features 405A may be dependent on the formation of the core 1 features 401A, core 2 features 402A, side-spacers 415A, and side spacers 425A. It may be desired that the spacing be uniform between the final features 405A. It may also be desired that the line width or line CD of the final features 405A be uniform across the wafer 101. A variation between the line CD of final features 405A across the wafer is referred to as critical dimension non-uniformity (CDNU). It is desired that CDNU be minimized across the wafer 101. CDNU can lead to device failure for some die formed on wafer 101, and/or to variation in device performance for different die formed on the same wafer or on different wafers. Embodiments of the present disclosure provide for performing automated feedforward and/or feedback control for double patterning processes to manage introduced variability (e.g., minimize CDNU).

Figure 5:
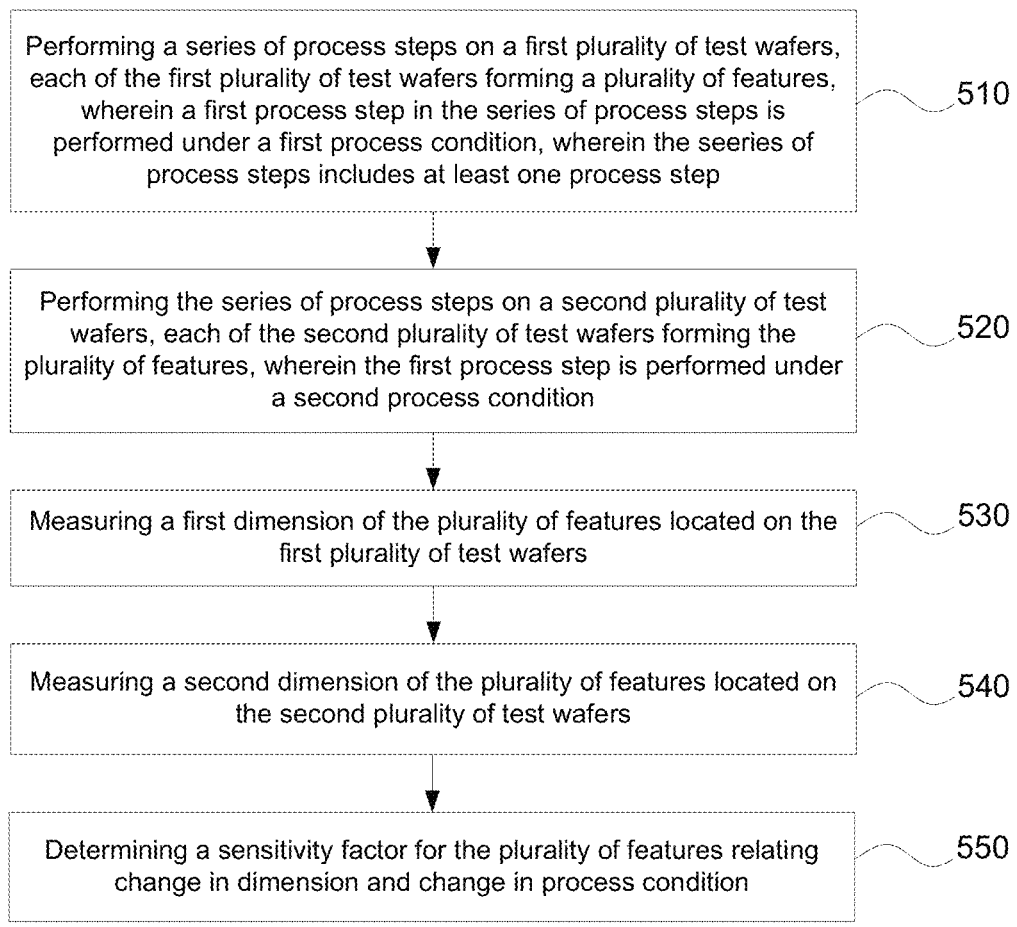
FIG. 5 is a flow diagram illustrating a method for generating a mathematical model including one or more sensitivity factors for purposes of performing automated feedforward and feedback control for a double patterning process performed on a substrate to manage variability introduced during each step of multi-patterning processes, in accordance with one embodiment of the disclosure.

FIG. 5 is a flow diagram illustrating a method for generating a mathematical model including one or more sensitivity factors for purposes of performing automated feedforward and/or feedback control for multi-patterning processes performed on a substrate to manage variability introduced during each step of the multi-patterning processes, in accordance with one embodiment of the disclosure. For example, the mathematical model may be used for feedback control by determining a variation in an output (e.g., dimensions of final features on a wafer) of multi-patterning processes that may be caused by process variability. In another example, the mathematical model may be used for feedforward control by adjusting for variations in input variables for process steps (e.g., variation of incoming PR mandrel dimension from a desired dimension) while performing multi-patterning processes so that the output (e.g., dimensions of final features on a wafer) achieves a target.

The mathematical model includes one or more sensitivity factors that provide sensitivities of feature dimensions (e.g., dimensions of final features, trim, deposition) to temperature and time. These sensitivity factors may be determined through empirical testing, such as measurements of process variations or disturbances.

At 510, the method includes performing a series of process steps on a first plurality of test wafers, wherein each of the first plurality of test wafers form a plurality of features. The test wafers may be blanket wafers and/or topographic wafers (e.g., having features). For example, the series of process steps may be included in multi-patterning processes performed on a wafer (e.g., SADP processes), and includes at least one process step (e.g., a first patterning of SADP processes). A first process step in the series of process steps is performed under a first process condition. At 520, the method includes performing the series of process steps on a second plurality of test wafers, wherein each of the second plurality of test wafers form the plurality of features. More particularly, the first process step is performed under a second process condition.

In that manner, variation between the first and second plurality of test wafers as determined (e.g., measured) at an intermediate position within the series of process steps, or at the end of performing the series of process steps may be used to generate one or more sensitivity factors, for example, to build the mathematical model. In particular, at 530, the method includes measuring a first dimension of the plurality of features located on the first plurality of test wafers. Also, at 540, the method includes measuring a second dimension of the plurality of features located on the second plurality of test wafers. Measurements of the first or second dimension may be accomplished by measuring each of the plurality of features on respective pluralities of test wafers to determine a plurality of dimensions. An average of the plurality of dimensions becomes the first or second dimension. The plurality of features may be measured at an intermediate point or at the end of the series of process steps.

At 550, the method includes determining a sensitivity factor for the plurality of features relating change in dimension and change in process condition. In one embodiment, the sensitivity factor is based on a difference between the first process condition and the second process condition, and based on a difference between the first dimension and the second dimension.

In one embodiment, the first process condition is a first temperature of a pedestal and/or ESC of the pedestal, wherein the pedestal is configured for wafer support. The first process step could be an etch process step, wherein the etch process may include a trim process. In this case, the second process condition is a second temperature of the pedestal and/or ESC. Given the above, the sensitivity factor may be a trim sensitivity factor relating a change in dimension of the plurality of features and change in temperature of the ESC and/or pedestal. In one embodiment, the sensitivity factor may indicate the sensitivity of an etch and/or trim process (as the first process step) to temperature, as translated to dimensions determined from final features formed at the end of the multi-patterning processes. In another embodiment, the dimension is determined from intermediate features formed during the multi-patterning processes.

In another embodiment, the first process condition is a first time period for performing an etch process step as the first process step, wherein the etch process may include a trim process. The second process condition is a second time period for performing the etch and/or trim process step. Given the above, the sensitivity factor may be a trim sensitivity factor relating a change in a dimension of the plurality of features and change in time for performing the etch and/or trim process step. In one embodiment, the sensitivity factor may indicate the sensitivity of an etch and/or trim process (as the first process step) to time, as translated to dimensions determined from final features formed at the end of the multi-patterning processes. In another embodiment, the dimension is determined from intermediate features formed during the multi-patterning processes.

In another embodiment, the first process condition is a first temperature of an ESC and/or pedestal configured for wafer support. The first process step could be a deposition step. The second process condition is a second temperature of the ESC and/or pedestal. Given the above, the sensitivity factor may be a deposition sensitivity factor relating a change in dimension of the plurality of features and change in temperature of an ESC and/or pedestal. In one embodiment, the sensitivity factor may indicate the sensitivity of a deposition process (as the first process step) to temperature, as translated to dimensions determined from final features formed at the end of the multi-patterning processes. In another embodiment, the dimension is determined from intermediate features formed during the multi-patterning processes.

In still another embodiment, the first process condition is a first number of cycles of a deposition step (e.g., ALD) that is the first process step. The second process condition is a second number of cycles of the deposition step. Given the above, the sensitivity factor is a deposition sensitivity factor relating a change in dimension of the plurality of features and change in a number of atomic layer deposition cycles when performing a deposition process step as the first process step. In one embodiment, the sensitivity factor may indicate the sensitivity of a deposition process (as the first process step) to temperature, as translated to dimensions determined from final features formed at the end of the multi-patterning processes. In another embodiment, the dimension is determined from intermediate features formed during the multi-patterning processes.

Figure 6A:
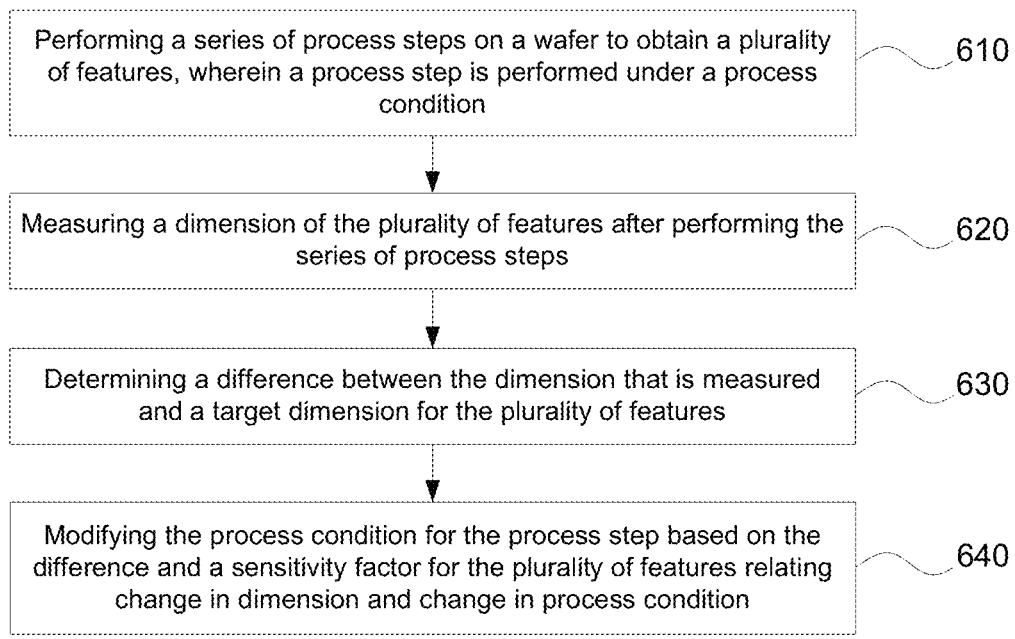
FIG. 6A is a flow diagram illustrating a method for automated feedback control for a double patterning process performed on a substrate to manage variability introduced during one or more steps of multi-patterning processes, in accordance with one embodiment of the disclosure.

FIG. 6A is a flow diagram 600A illustrating a method for automated feedback control for multi-patterning processes performed on a substrate to manage variability introduced during one or more steps of the multi-patterning processes, in accordance with one embodiment of the disclosure. For example, the multi-patterning processes may be self-aligned double patterning processes. Feedback control involves observing the dimensions of final features formed on a wafer after performing multi-patterning processes, and makes adjustments to one or more processes to correct for variations in those dimensions from a target or desired dimension on a subsequent wafer.

In one embodiment, the multi-patterning processes are SADP processes. Feedback control is applied at the first patterning of the SADP processes, to include a wet etch process which may include a trim process, and a deposition process. The first patterning may be performed in a first chamber, while the second patterning in the SADP processes is performed in a second chamber. Feedback control may be implemented to tune the processes in the first patterning as performed in the first chamber.

At 610, the method includes performing a series of process steps on a wafer to obtain a plurality of features, wherein a process step is performed under a process condition. For example, the series of process steps may be multi-patterning processes, such as SADP processes. The process step may be included within the first patterning of the SADP processes. Also, the features may be final features formed at the end of the series of process steps, such as final features 405A of FIG. 4H.

At 620, the method includes measuring a dimension of the plurality of features after performing the series of process steps. In particular, each of the dimensions of the plurality of features is measured to obtain a plurality of dimensions. The dimensions may be measured from final features formed after finishing the series of process steps, such as SADP processes. For example, the dimensions may be line CDs for the final features 405A of FIG. 4H. An average of the plurality of dimensions becomes the dimension of the plurality of features.

At 630, the method includes determining a difference between the dimension that is measured and a target dimension for the plurality of features. For example, the target dimension may be a customer specified line CD of the final features 405A formed through SADP processes.

Feedback control is used to adjust at least one process step in the first patterning of the multi-patterning (e.g., SADP) processes so that subsequent wafers can achieve dimensions of final features that match the target dimension. In particular, at 640, the method includes modifying the process condition for the process step based on the difference and a sensitivity factor for the plurality of features relating change in dimension and change in process condition. As previously described, the sensitivity factor may be a mathematical model used for relating a variation in an output (e.g., dimensions of final features on a wafer) to process variability. In that manner, given a variation in output, a change in the process conditions may be determined from the sensitivity factor to achieve an output that has the target dimensions. As such, the series of process steps is performed, including the process step that is modified, on another at least one subsequent wafer, so that the subsequent wafer achieves dimensions of the final features that are the target dimension.

In one embodiment, the process condition is a temperature of an ESC and/or pedestal configured for wafer support. For example, the process condition could be one or more temperatures that are applied to one or more heater zones of the ESC and/or pedestal. The process step could be an etch process step, which may include a trim process. In that case, the sensitivity factor may be a trim sensitivity factor relating a change in dimension of the plurality of features and change in temperature of the ESC and/or pedestal, or change in temperature for a heater zone in the ESC and/or pedestal. That is, the sensitivity factor indicates the sensitivity of an etch and/or trim process to temperature, as translated to dimensions determined from final features formed at the end of the multi-patterning processes. As such, the temperature may be modified when performing the etch process step for subsequent wafers.

In another embodiment, the process condition is a temperature of the ESC and/or pedestal configured for wafer support. For example, the process condition could be one or more temperatures that are applied to one or more heater zones of the ESC and/or pedestal. The process step could be a deposition step. In that case, the sensitivity factor may be a deposition sensitivity factor relating a change in dimension of the plurality of features and change in temperature of an ESC and/or pedestal, or changes in temperatures for one or more heater zones of the ESC and/or pedestal. That is, the sensitivity factor may indicate the sensitivity of a deposition process to temperature, as translated to dimensions determined from final features formed at the end of the multi-patterning processes. As such, the temperature may be modified (e.g., for one or more heater zones) when performing the deposition process step for subsequent wafers. In still another embodiment, the process step could be a combination of the etch process step, which may include the trim process and the deposition step. In that case, the sensitivity factor indicates a sensitivity of both the etch and deposition processes as translated to dimensions determined from final features, wherein the sensitivity factor relates a change in dimension of the plurality of features and a change in temperature of the ESC and/or pedestal. As such, a steady state temperature may be modified when performing the etch and deposition process steps for subsequent wafers.

In one embodiment, the process condition is a time for performing the process step, wherein the process step is an etch process, which may include a trim process. In that case, the sensitivity factor may be a trim sensitivity factor relating a change in dimension of the plurality of features and change in time for performing the etch process. That is, the sensitivity factor indicates the sensitivity of an etch and/or trim process to time, as translated to dimensions determined from final features formed at the end of the multi-patterning processes. As such, the time period for performing the etch and/or trim processes may be modified on subsequent wafers.

In another embodiment, the process condition is a number of cycles of a deposition step that is the process step. In that case, the sensitivity factor may be a deposition sensitivity factor relating a change in dimension of the plurality of features and change in a number of atomic layer deposition cycles when performing the deposition step. As such, the number of ALD cycles may be modified on subsequent wafers. In another case, the deposition sensitivity factor relates a change in dimension of the plurality of features and change in the overall time period for performing the deposition step. As such, the overall time period for performing deposition may be modified on subsequent wafers.

Figure 6B:
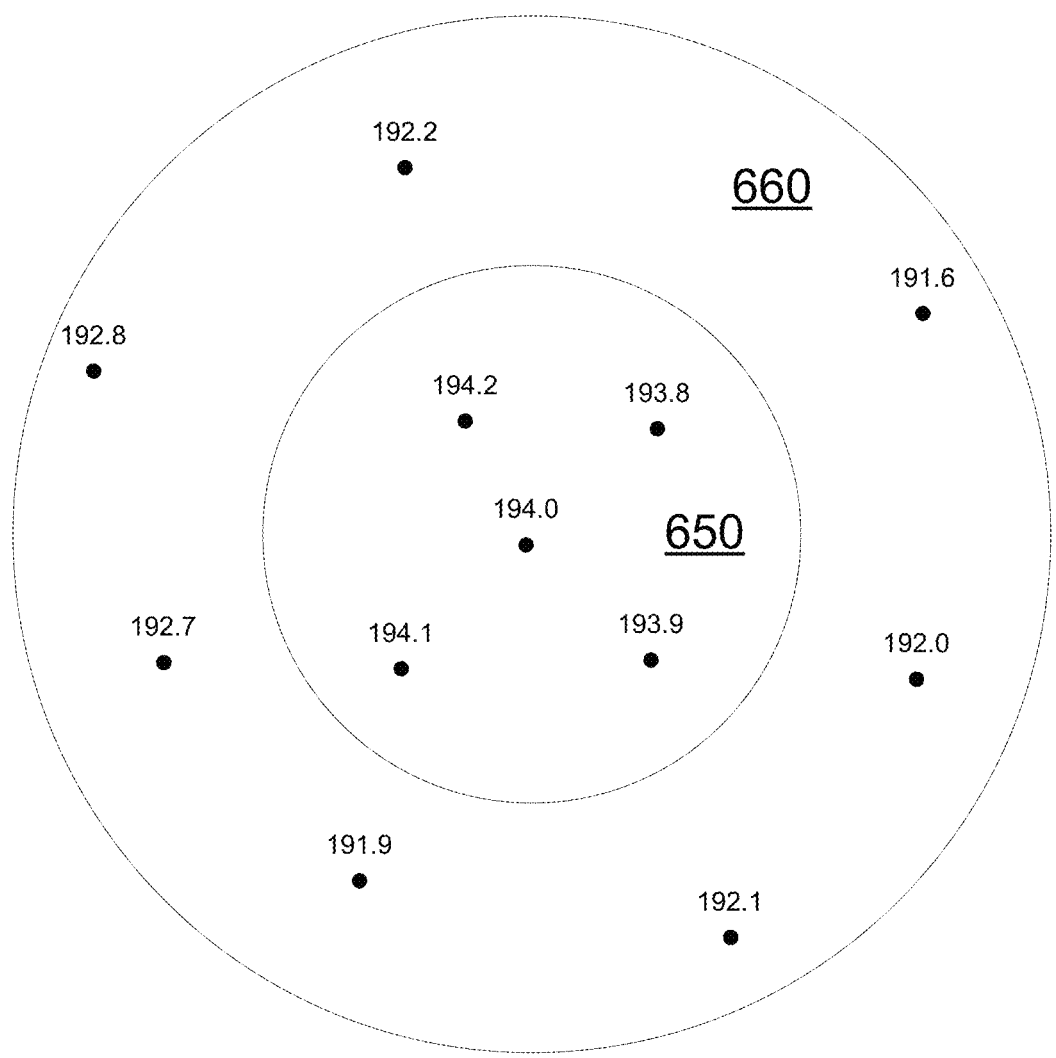
FIG. 6B illustrates nonuniformity of the distribution of dimensions (e.g., line CD) of a plurality of final features after performing SADP processes on a wafer, such as those shown in FIGS. 4A-4H.

FIG. 6B illustrates nonuniformity of the distribution of dimensions (e.g., line CD) of a plurality of final features after performing SADP processes on a wafer, such as those shown in FIGS. 4A-4H. For example, a SADP processes are performed on a wafer that is placed on a pedestal that has a temperature of 50 degrees Celsius across each of its heater zones. As shown, dimensions of line CDs of final features in an outer radial zone 660 are about 192 Angstroms. Also, dimensions of line CDs of final features in an inner radial zone 650 are about 194 Angstroms. That is, the final features on the wafer have a domed distribution of dimensions for line CDs, wherein the final features in the inner radial zone 650 are wider than the final features in the outer radial zone 660. A difference of about 2 Angstroms exists between dimensions of line CDs of final features located in the inner and outer radial zones. For example, a trim sensitivity factor may be selected to provide feedback control, such that a change in the temperature is applied to one or more heater zones corresponding to the inner radial zone 650, if for example, it is desired to achieve a flat profile across the wafer having dimensions similar to those found in the outer radial zone 660. As such, a modified temperature is applied to the one or more heater zones to reduce the dimensions in the inner radial zone 650 (e.g., by 2 Angstroms), so that the dimensions of line CDs for the final features across the entire wafer is flat (e.g., dimensions are about 192 Angstroms across the wafer). As previously described, the sensitivity factor indicates the sensitivity of an etch and/or trim process to temperature, as translated to dimensions of line CDs determined from final features formed at the end of the multi-patterning processes. The trim sensitivity factor is defined in Equation 1.

$$\text{Trim Sensitivity Factor} = \frac{\text{delta line } CD \text{ (Angstroms)}}{\text{delta Temperature (degrees C)}} \quad (1)$$

Figure 7:
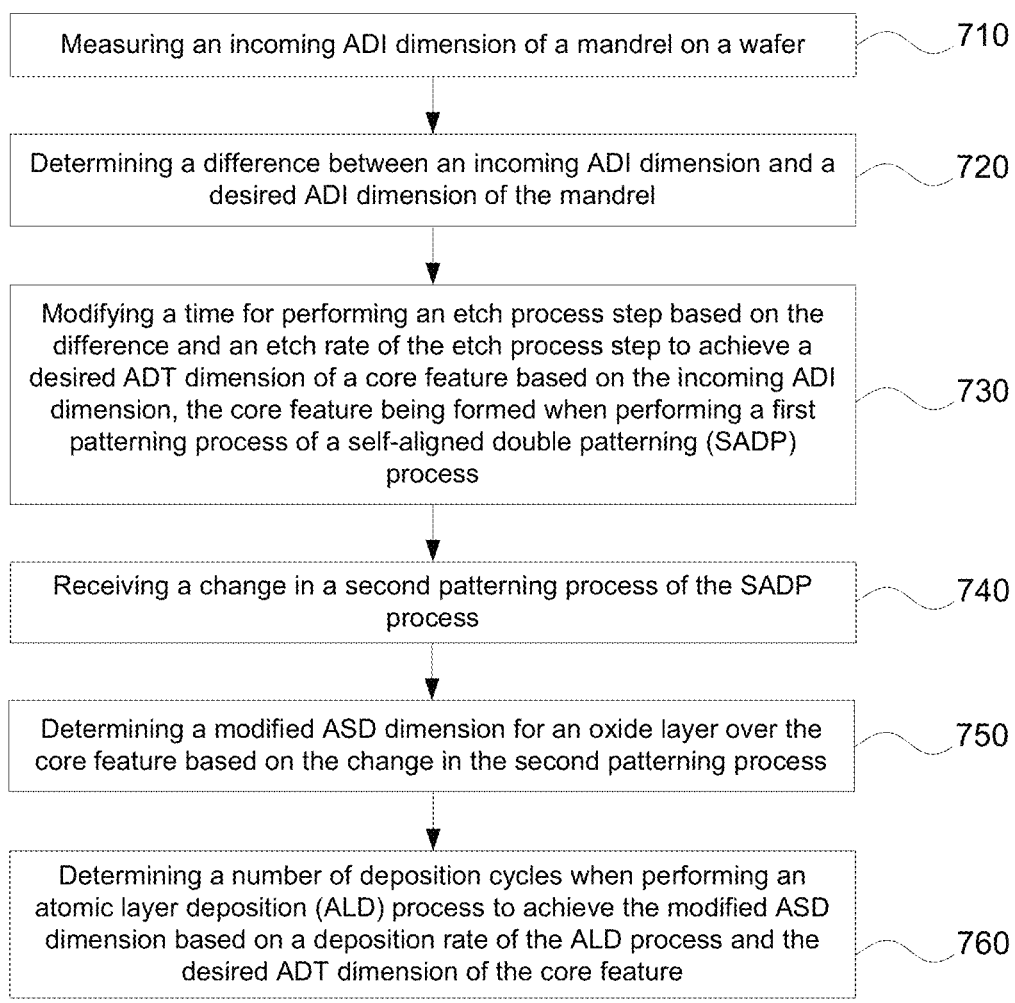
FIG. 7 is a flow diagram illustrating a method for automated feedforward control for a double patterning process performed on a substrate to manage variability introduced during one or more steps of multi-patterning processes, in accordance with one embodiment of the disclosure.

FIG. 7 is a flow diagram illustrating a method for automated feedforward control for multi-patterning processes performed on a substrate to manage variability introduced during one or more steps of multi-patterning processes, in accordance with one embodiment of the disclosure. Feedforward control employs advanced software algorithms in combination with proprietary hardware technology to enable localized fine tuning that minimizes variation across the wafer by correcting for variability in control parameters and/or process conditions. For example, feedforward control involves a measuring and/or determining a control parameter of one of the processes of the multi-patterning processes performed on a wafer, and responding to variability in that control parameter from a desired value in order to reduce effects of that variability on the output (e.g., final line CD dimensions of a wafer) of the multi-patterning processes for that wafer. Feedforward control requires a mathematical model that accurately predicts the effects of variabilities of control parameters on the output of the multi-patterning processes for a particular wafer. In particular, for feedforward control, modifications made to process conditions of process steps in the SADP processes are based on knowledge of processes In a feedforward system, accounting for the variabilities in the control parameter is based on knowledge about the processes in the multi-patterning processes in the form of a mathematical model including sensitivity factors, and knowledge about or measurements of the process changes. In one embodiment, critical dimensions of final features formed at the end of the multi-patterning processes are of desired dimensions. In another embodiment, the critical dimensions of final features may be different than desired.

In one embodiment, the multi-patterning processes are SADP processes. Feedforward control may be applied at the first patterning of the SADP processes, to include a wet etch process which may include a trim process, and a deposition process. The first patterning may be performed in a first chamber, while the second patterning in the SADP processes is performed in a second chamber. Feedforward control may be implemented to tune the processes in the first patterning as performed in the first chamber.

At 710, the method includes measuring an incoming ADI dimension of a mandrel on a wafer. In particular, ADI dimensions of a plurality of PR mandrels on an incoming wafer may be measured, wherein the wafer is introduced into a chamber configured to perform the first patterning of the SADP processes. An average of the ADI dimensions may be taken to determine the incoming ADI dimension of a representative mandrel, wherein the incoming ADI dimension is used for feedforward control. For example, FIG. 4A illustrates the ADI dimension of the PR mandrel 403.

For the SADP processes, there is a desired incoming ADI dimension of the PR mandrel that when achieved minimizes variability introduced when performing the steps of the SADP processes. At 720, the method includes determining a difference between an incoming ADI dimension and a desired ADI dimension of the mandrel, wherein the difference is the variability. Any difference or variability in the incoming ADI dimension of the PR mandrel from the desired ADI dimension will have an effect on subsequent steps in the SADP processes that base their process conditions on having the incoming ADI dimension being the desired ADI dimension. Embodiments of the present disclosure are able to account for variability in the incoming ADI dimension to reduce the effects of that variability on the SADP processes (e.g., so that the line CD dimensions of features formed during performance of the SADP processes are similar to desired dimensions). For example, variability may include an increase in the incoming ADI dimension from the desired ADI dimension, or variability may include a decrease in the incoming ADI critical dimension from the desired ADI critical dimension. In response, a change in process conditions in the first patterning of the SADP processes may be implemented through feedforward control to account for variability in the incoming ADI dimension of the PR mandrel.

At 730, the method includes modifying a time for performing an etch process step based on the difference or variability in the incoming ADI dimension of the PR mandrel from the desired ADI dimension and an etch rate of the etch process step, wherein the etch process step may include a trim process step. For example, the etch rate may be based on a sensitivity factor relating a change in ADI critical dimension and change in time (e.g., per unit time and for a given temperature). Modification of the time is implemented to achieve a desired ADT dimension of a core feature based on the incoming ADI dimension. The core feature being formed when performing a first patterning process of a self-aligned double patterning (SADP) process.

For example, the incoming ADI dimension of 320 Angstroms may be larger than a desired ADI critical dimension of 300 Angstroms. FIG. 4B illustrates performance of wet etch and trim processes to form core 1 features 401A having an ADT critical dimension. Because of the variability in the incoming ADI critical dimension, subsequent process steps that assume that the incoming ADI critical dimension has no variability (i.e., is of the desired ADI dimension) would produce an ADT critical dimension of a core feature that is also larger than desired. For purposes of illustration, the ADT critical dimension of the core feature may also be larger by 20 Angstroms from the desired ADT critical dimension. Given the variability in the incoming ADI critical dimension (e.g., increase of 20 Angstroms), the time for performing the etch and/or trim process steps may be increased from the normal time (assuming that the incoming PR mandrel is of a desired ADI critical dimension) in order to achieve the desired ADT critical dimension for each of the core features. That is, extending the time for performing the etch and/or trim process steps accounts for the variability in the incoming ADI critical dimension of the PR mandrel so that more laterally etching occurs on the core features to achieve the desired ADT critical dimension. In particular, the increased time for etching may laterally etch 10 Angstroms from each side of a representative core feature. In that manner, the ADT critical dimension of the core feature formed during the SADP processes would be similar to the desired ADT dimension of the core feature. As such, the effect of the variability in a process condition (i.e., an increase of the incoming ADI critical dimension from a desired ADI critical dimension) has been minimized through feedforward control by adjusting a process condition of a subsequent process step (i.e., adjusting the time of the etch and/or trim process steps).

Feedforward control may be implemented to account for changes in process conditions from designed process conditions for one or more subsequent process steps. In particular, at 740, the method includes receiving a change in a process step of the second patterning processes of the SADP processes, in accordance with one embodiment of the disclosure. For example, the second patterning processes may include a dry etch process, such that a corresponding process condition for the dry etch process may be changed.

At 750, the method includes determining a modified ASD dimension for an oxide layer over the core feature based on the change in the second patterning process. That is, the ASD dimension may have a desired dimension based on the original process conditions expected when performing the dry etch process during the second patterning process. FIG. 4C illustrates performance of conformal deposition and selective etching processes to form the spacer 1 DEP 415 over the core 1 features 401A, wherein the spacer 1 DEP 415 has an ASD critical dimension measured in a horizontal direction substantially parallel to bottom surface 412 of wafer 101. However, the change in the second patterning process may require through feedforward control a change in the ASD dimension for the oxide layer, wherein the change is associated with the modified ASD dimension.

As previously described, the oxide layer as spacer 1 DEP 415 conforming to the core 1 features 401A may be formed through atomic layer deposition. Because the modified ASD dimension is known, at 760, the method includes determining a number of deposition cycles when performing an atomic layer deposition (ALD) process to achieve the modified ASD dimension based on a deposition rate of the ALD process and the desired ADT dimension of the core feature upon which the oxide layer is deposited (e.g., in the lateral direction). For example, the deposition rate may be based on a sensitivity factor relating a change in ASD dimension per deposition cycle (e.g., for a given temperature). As such, the change to the process condition in a subsequent process step (e.g., dry etch in the second patterning of SADP processes) has been accounted for through feedforward control by adjusting a process condition of a previous process step (i.e., adjusting the number of cycles of deposition when performing atomic layer deposition in the first patterning of SADP processes to achieve the modified ASD dimension for an oxide layer over a corresponding core feature).

Figure 8A:
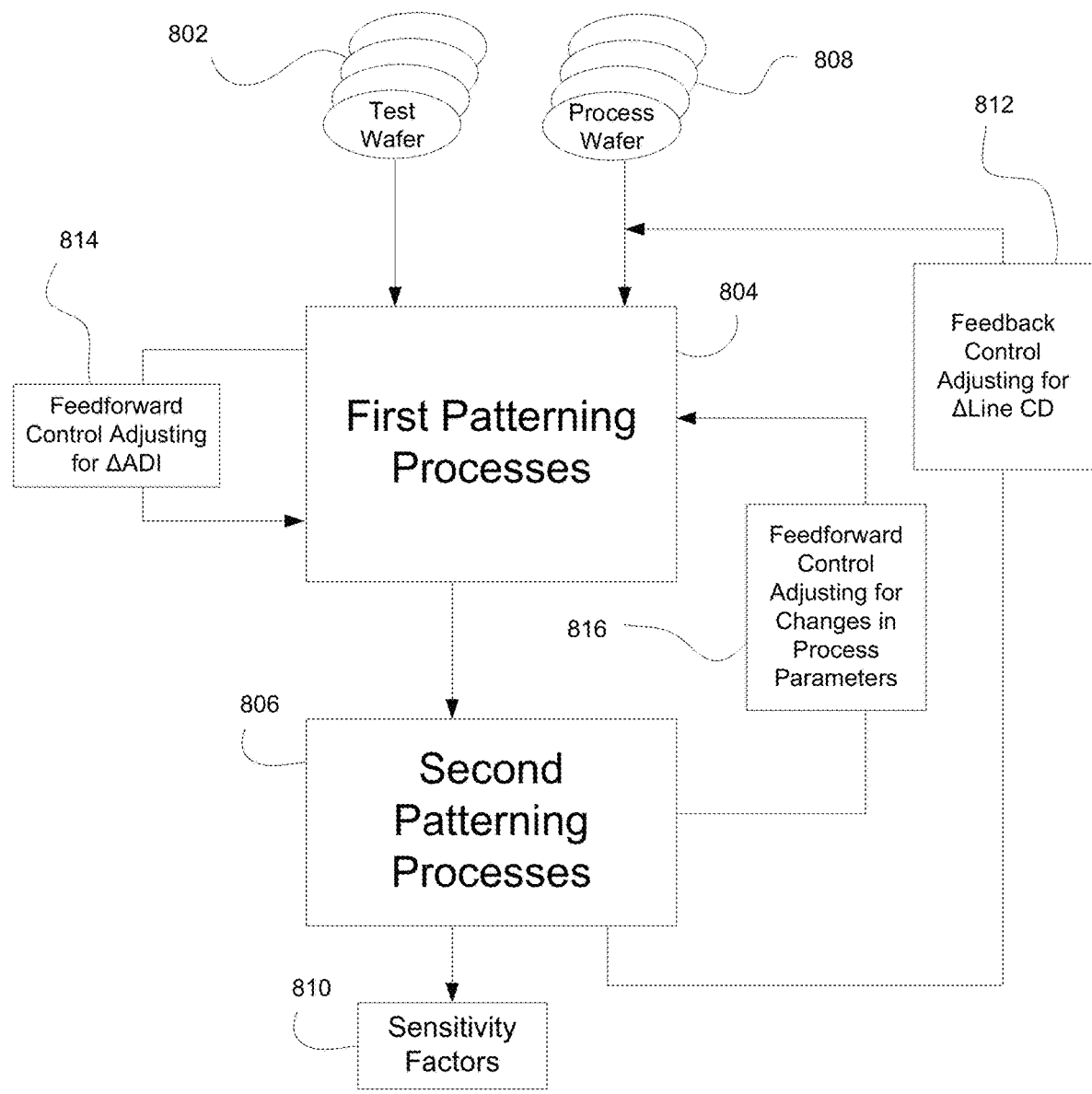
FIG. 8A is a diagram 800A illustrating a workflow for performing feedback and/or feedforward control on the ESC and/or pedestal when performing multi-patterning processes, in accordance with embodiments of the disclosure.

FIG. 8A illustrates a workflow 800A for determining sensitivity factors and performing feedback and/or feedforward control when performing multi-patterning processes, in accordance with one embodiment of the disclosure. Workflow 800A can be implemented in any of the multi-patterning processes previously introduced in FIGS. 4-7 using sensitivity factors previously described and also described in FIGS. 8B-8D.

For purposes of illustration, the multi-patterning processes shown in workflow 800A includes first patterning processes 804 and second patterning processes 806, such as in SADP processes, previously described in FIGS. 4A-4H, though it is understood that any number of process steps for any multi-patterning processes may be performed for purposes of performing feedback and/or feedforward control. For example, the first patterning processes 804 includes etch and trim (e.g., wet etch and/or trim) as well as deposition processes, and the second patterning processes 806 includes etch and/or trim (e.g., dry etch and/or trim) as well as deposition processes, as previously described in relation to FIGS. 4A-4H.

Empirical testing is performed for purposes of building a mathematical model that may be used for feedback and/or feedforward control, as previously described. For example, feedback control may adjust for variabilities in control parameters or process conditions of multi-patterning processes. In another example, the mathematical model may be used for feedforward control by adjusting for variations in input variables for process steps (e.g., variation of incoming PR mandrel dimension from a desired dimension or changes to subsequent process steps in the second patterning) while performing multi-patterning processes so that the output (e.g., dimensions of final features on a wafer) achieves a target. The mathematical model includes one or more sensitivity factors that provide sensitivities of feature dimensions (e.g., dimensions of final features, trim, deposition) to temperature and time. These sensitivity factors may be determined through empirical testing, such as measurements of process variations or disturbances.

As previously described in relation to FIG. 5, testing may be performed under two process conditions for a plurality of test wafers 802 (e.g., blanket wafers or feature/topographic wafers) for purposes of determining sensitivity factors. For purposes of illustration, a first process condition includes a first steady state (SS) temperature, and a second process condition includes a second steady state temperature in the first patterning of processes 804. Other process conditions were previously described, and are also further described in relation to FIGS. 8B-8D.

As such, etch and trim as well as deposition processes using the process conditions are performed on the plurality of test wafers 802 for the first patterning processes 804 and/or the second patterning processes 806. In particular, etch and trim as well as deposition processes in the first patterning of processes 804 may be performed on the wafers (e.g., feature/topographic wafers), to include first patterning 804 of SADP processes, wherein features having ADI critical dimensions and features having ASD critical dimensions, as well as other features having other critical dimensions may be determined (e.g., measured by metrology tool). In addition, difference or delta data for ADI and ASD critical dimensions may be collected between the two process conditions. Other measurements of features may be taken at any point during the first patterning processes 804 and/or second patterning processes 806, as well as taking measurements of dimensions of final features formed at the end of the second patterning processes 806. Also, temperature readings may include a set of on-wafer temperature vs. x-y coordinate data that correspond to locations on the wafer.

In one embodiment, transient temperature conditions are considered when determining sensitivity factors 810, in one embodiment. In particular, while deposition is performed typically after the wafer hits a steady state temperature, such as reaching the temperature corresponding to heater zones of the ESC, etch and trim processes are performed under transient temperature conditions, such as while the wafer is coming up to the steady state temperature. Transient temperature conditions define the actual evolution of the temperature during etch and/or trim processes before reaching a steady state temperature. As such, the transient temperature conditions may be considered when determining differences in measurements of features in wafers while performing the process steps under the two process conditions.

Based on the data collected, trim and deposition sensitivity factors 810 may be determined, as previously described. For example, differences between feature critical dimensions and temperature conditions measured for the two process conditions may be used to generate etch and/or trim as well as deposition sensitivity factors 810. Also, blanket deposition profile data and/or measurements may be used for determining deposition sensitivity factors 810. For example, a blanket deposition process may be performed on the wafers, wherein blanket deposition profile data and/or measurements are determined (e.g., from metrology tool) to determine sensitivity factors (e.g., deposition rate, etc.). In addition, difference data in deposition thickness may collected between the two process conditions during the first patterning of processes 804 to determine deposition sensitivity factors. Sensitivity factors 810 are further described in relation to FIGS. 8B-8D.

The sensitivity factors 810 can be used for purposes of feedback and/or feedforward control based on one or more measurements of control parameters taken during and/or at the end of the multi-patterning processes. That is, feedback control 812 may be used to make adjustments to process conditions for processing subsequent wafers based on measurements taken for a current wafer, as previously described in relation to FIG. 6A. Also feedforward control 814 may be performed on a current wafer to adjust for variability in critical dimensions of features measured during performing first patterning processes so that variability does not affect subsequent processes, as previously described in relation to FIG. 7. Further, feedforward control 816 may be performed on a current wafer to adjust for changes in process parameters and/or process conditions that are made to subsequent processes (e.g., changes to a process in the second patterning processes 806), as previously described in relation to FIG. 7.

For example, for feedback control 812 it may be desired to have a flat profile across a wafer after performing multi-patterning processes (e.g., SADP processes). Critical dimensions of final features on a process wafer 808 may be determined (e.g., from metrology tool), wherein the measurements may include x-y coordinate data on a wafer. When the measurements indicate that critical dimensions differ from desired settings, adjustments to process conditions may be determined based on a corresponding sensitivity factor and the difference between measured and desired dimensions. For example, measurements may indicate a domed profile for a process wafer 808, wherein dimensions of final features (e.g., line CDs) are larger in an inner radial zone than dimensions of final features in an outer radial zone. Feedback control may be implemented by providing an adjustment to a heater zone (e.g., new temperature for the heater zone) to account for the average difference between measured and desired dimensions (e.g., dimensions of final features after performing the multi-patterning processes) by using a corresponding sensitivity factor. In that manner, after making adjustments to process conditions for a subsequent process wafer 808, there is a flat profile of dimensions of final features across both inner and outer radial zones.

Feedforward control 814 may be performed to adjust for variability in critical dimensions (e.g., ADI) of features (e.g., incoming PR mandrel) measured during performing first patterning processes so that variability does not affect subsequent processes (e.g., second patterning processes) and a subsequently formed feature matches its desired dimension. As previously described, when a measured incoming ADI critical dimension is offset from the desired critical dimension, an adjustment may be made to processes in the first patterning processes so that an output from the first patterning processes match expected dimensions. For example, when the incoming ADI critical dimension is too large, an increase in etch and/or trim processes may be performed to neutralize any effect that variability may have on subsequent processes. In that manner, dimensions of intermediate and/or final features (e.g., line CDs) for the current wafer that were formed when performing multi-patterning processes using feedforward control may match desired dimensions.

In addition, feedforward control 816 may be performed to adjust for changes in process parameters and/or process conditions that are made to subsequent processes (e.g., changes to a process in the second patterning processes 806) when processing a current wafer. That is, feedforward control may be implemented to adjust for changes made to subsequent process steps (e.g., second patterning processes 806, such as dry etch) that require a change in previous process steps (e.g., first patterning processes 804). For example, an adjustment to process steps in one or more steps in the first patterning processes 804 may include changes to etch and/or trim processes to hit newly determined target ASD dimensions (e.g., temperature, time, etc.) and/or changes to deposition processes (e.g., blanket thickness) to hit newly determined target ASD dimensions, etc.

Figure 8B:
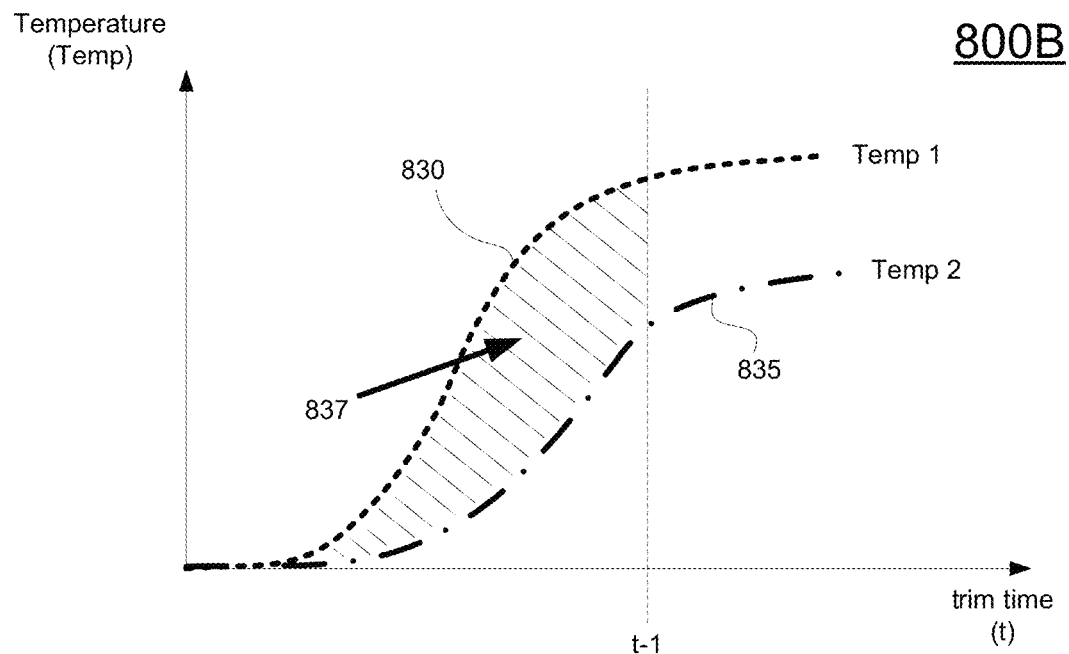
FIG. 8B is a diagram 800B illustrating the temperature profile evolutions for an etch and/or trim process for two different steady state temperature conditions to determine trim sensitivity to temperature for use when performing feedback control for multi-patterning processes, in accordance with one embodiment of the disclosure.

FIG. 8B is a diagram 800B illustrating the temperature profile evolutions for an etch and/or trim process for two different steady state temperature conditions to determine trim sensitivity to temperature for use when performing feedback and/or feedforward control for multi-patterning processes, in accordance with one embodiment of the disclosure. The y-axis indicates temperature, and the x-axis is the elapsed time for performing the etch and/or trim processes. Two different process conditions are presented in diagram 800B, including a first temperature (Temp 1) and a second temperature (Temp 2). Temperature profile 830 shows the evolution of temperature on the wafer when performing first patterning (etch and/or trim processes) of multi-patterning processes (e.g., SADP processes) using the first process condition (Temp 1). Temperature profile 835 shows the evolution of temperature on the wafer when performing first patterning (etch and/or trim processes) of multi-patterning processes (e.g., SADP processes) using the second process condition (Temp 2). The area under each temperature profile up to time $t_1$ corresponds to the total heat input applied to a corresponding wafer, wherein the total heat applied also corresponds to a trim amount performed on the wafer. As shown, time $t_1$ occurs during the etch and/or trim processes, which typically occurs within the first 30 to 60 seconds of placing the wafer on the ESC. As such, up to time $t_1$, the difference or delta heat input between the two process conditions is indicated by area 837. In addition, the trim amounts corresponding to wafers undergoing etch and/or trim processes using two different process conditions as shown in each of the temperature profiles 830 and 835 can be measured. In another embodiment, the measurements are taken of line CDs determined from final features formed at the end of the multi-patterning processes, as previously described. A trim sensitivity factor relating the sensitivity of etch and/or trim processes to temperature may be determined, and is defined in Equation 2 below. In some cases, Equation 2 is closely related to Equation 1, previously presented.

$$\text{Trim Sensitivity Factor} = \frac{\text{delta trim (Angstroms)}}{\text{delta heat input (degrees C)}} \quad (2)$$

Figure 8C:
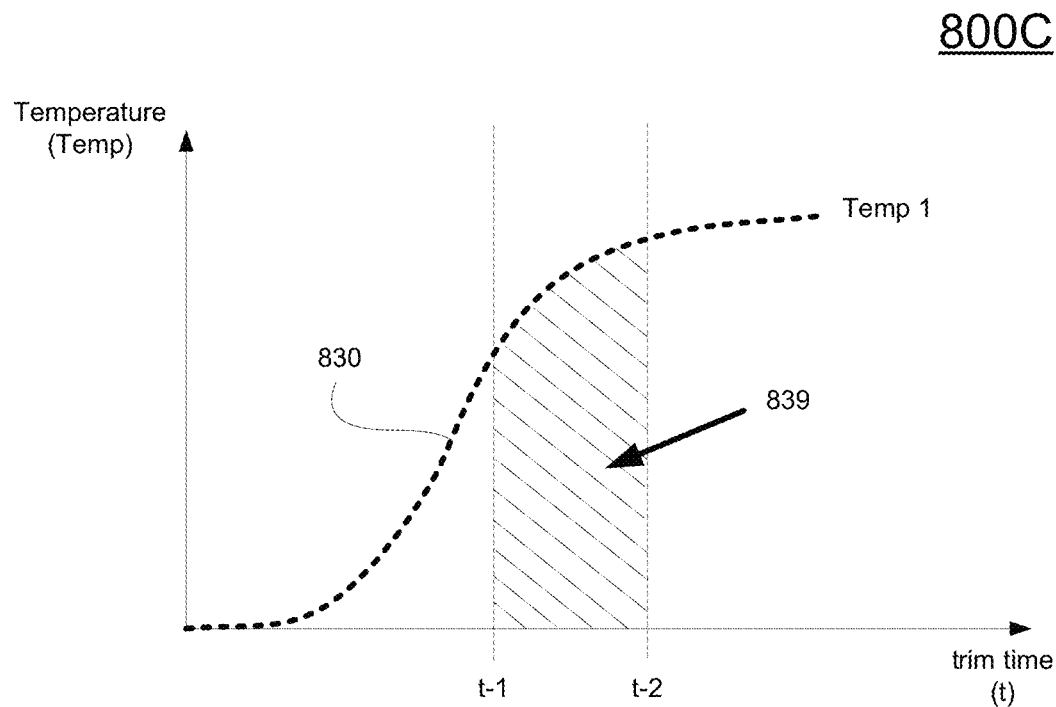
FIG. 8C is a diagram 800C illustrating a temperature profile evolution for an etch and/or trim process for a steady state temperature condition operating under two different time constraints to determine trim sensitivity to time for use when performing feedback control for multi-patterning processes, in accordance with one embodiment of the disclosure.

FIG. 8C is a diagram 800C illustrating a temperature profile evolution for an etch and/or trim process for a steady state temperature condition operating under two different time constraints (e.g., process conditions) to determine trim sensitivity to time for use when performing feedback and/or feedforward control for multi-patterning processes, in accordance with one embodiment of the disclosure. The y-axis indicates temperature, and the x-axis is the elapsed time for performing the etch and/or trim processes. Two different process conditions are presented in diagram 800B, including a first time ($t_1$) and a second time ($t_2$). Temperature profile 830 shows the evolution of temperature on the wafer when performing first patterning (e.g., etch and/or trim processes) of multi-patterning processes (e.g., SADP processes) using the two different process conditions (e.g., $t_1$ and $t_2$). The area under the temperature profile 830 up to a particular time (e.g., time $t_1$ or time $t_2$) corresponds to the total heat input applied to a corresponding wafer, wherein the total heat applied also corresponds to a trim amount performed on the wafer. As such, between the two times $t_1$ and $t_2$, the difference or delta heat input between the two process conditions is indicated by area 839. In addition, the trim amounts corresponding to wafers undergoing etch and/or trim processes up to time $t_1$ and up to time $t_2$ (the two different process conditions) can be measured. In another embodiment, the measurements are taken of line CDs determined from final features formed at the end of the multi-patterning processes, as previously described. A trim sensitivity factor relating the sensitivity of etch and/or trim processes to time may be determined, and is defined in Equation 3 below.

$$\text{Trim Sensitivity Factor} = \frac{\text{delta trim (Angstroms)}}{\text{delta time (seconds)}} \quad (3)$$

Figure 8D:
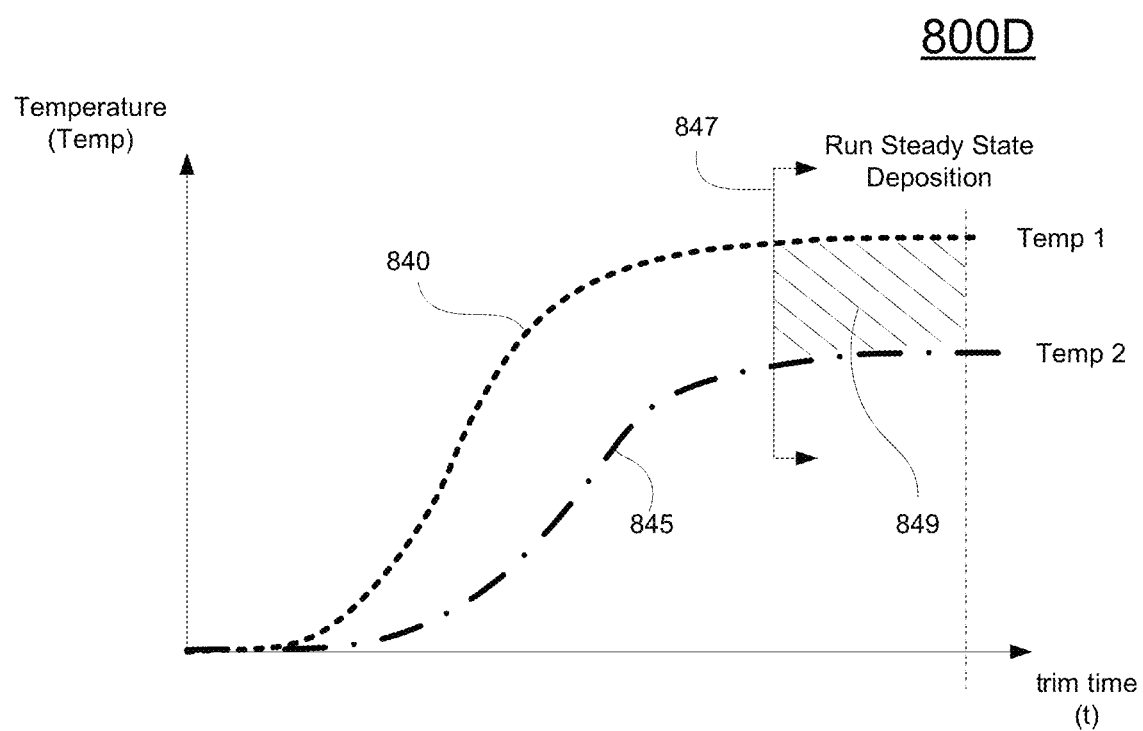
FIG. 8D is a diagram 800D illustrating a deposition rate for a deposition process performed for two different steady state temperature conditions to determine deposition sensitivity to temperature for use when performing feedback control for multi-patterning processes, in accordance with one embodiment of the disclosure.

FIG. 8D is a diagram 800D illustrating the determination of a deposition rate for a deposition process performed for two different steady state temperature conditions, wherein the deposition rate is based on deposition sensitivity to temperature and can be used when performing feedback and/or feedforward control for multi-patterning processes, in accordance with one embodiment of the disclosure. The y-axis indicates temperature, and the x-axis is the elapsed time for performing the etch and/or trim processes. Two different process conditions are presented in diagram 800D, including a first temperature (Temp 1) and a second temperature (Temp 2). Temperature profile 840 shows the evolution of temperature on the wafer when performing first patterning (etch and/or trim processes) of multi-patterning processes (e.g., SADP processes) using the first process condition (Temp 1). Temperature profile 845 shows the evolution of temperature on the wafer when performing first patterning (etch and/or trim processes) of multi-patterning processes (e.g., SADP processes) using the second process condition (Temp 2). Deposition processes typically occur after the wafer has reached steady state temperature, as indicated by demarcation line 847. While etch and trim processes take up to 30 seconds, the deposition process may be performed over a longer time period (e.g., 200 seconds), and mostly occurs when the wafer is in steady state for temperature. The area under each temperature profile up to time $t_1$ corresponds to the total heat input applied to a corresponding wafer, wherein the total heat applied also loosely corresponds to a deposition amount formed on the wafer. As shown, the deposition process is performed up to time $t_1$, which occurs after the demarcation line 847. The difference or delta heat input between the two process conditions is indicated by area 849. In addition, the deposition layer thickness corresponding to wafers undergoing etch and/or trim processes using two different process conditions as shown in each of the temperature profiles 840 and 845 can be measured. In another embodiment, the measurements are taken of line CDs determined from final features formed at the end of the multi-patterning processes, as previously described. A deposition sensitivity factor (or deposition rate) relating the sensitivity of the deposition process to temperature may be determined, and is defined in Equation 4 below.

$$\text{Trim Sensitivity Factor} = \frac{\text{delta deposition thickness (Angstroms)}}{\text{delta heat input (degrees C)}} \quad (4)$$

In addition, deposition thickness may be determined through a deposition sensitivity factor (or deposition rate) relating the sensitivity of the deposition process to the number of atomic layer deposition (ALD) cycles being performed. That is, deposition thickness is closely related to the number of ALD cycles performed (e.g., at a given temperature). In particular, a deposition sensitivity factor (e.g., deposition rate) relating the sensitivity of the deposition process to the number of ALD cycles performed may be determined, and is defined in Equation 5 below.

$$\text{Trim Sensitivity Factor} = \frac{\text{delta deposition thickness (Angstroms)}}{\text{delta } ALD \text{ cycles}} \quad (5)$$

Figure 9:
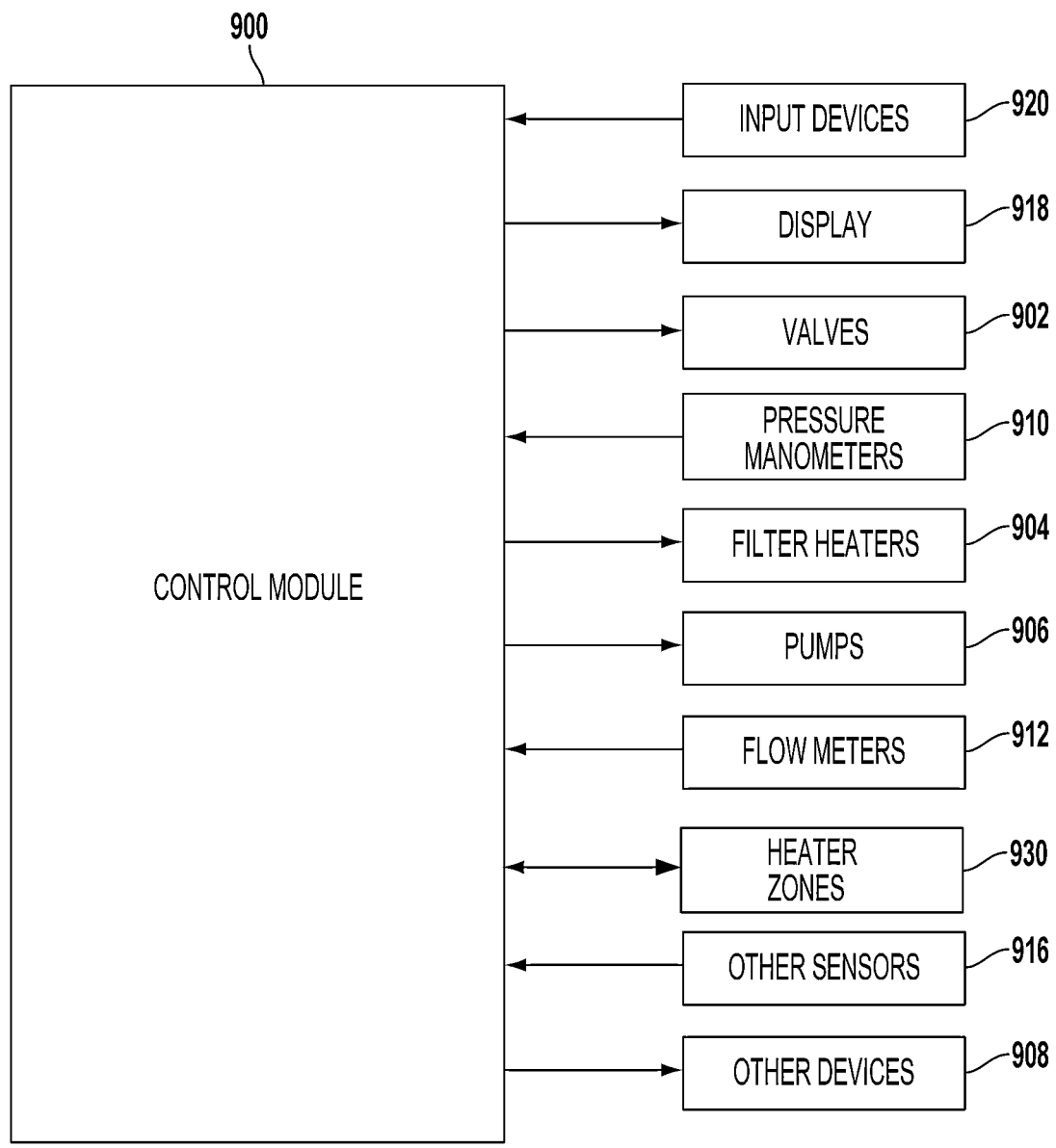
FIG. 9 shows a control module for controlling the systems described above, in accordance with one embodiment of the present disclosure.

FIG. 9 shows a control module 900 for controlling the systems described above. In one embodiment, the control modules 110 of FIG. 1A may include some of the example components of control module 900. For instance, the control module 900 may include a processor, memory and one or more interfaces. The control module 900 may be employed to control devices in the system based in part on sensed values. For example only, the control module 900 may control one or more of valves 902, filter heaters 904, pumps 906, zone heaters 950, and other devices 908 based on the sensed values and other control parameters. The control module 900 receives the sensed values from, for example only, pressure manometers 910, flow meters 912, and/or other sensors 916. The control module 900 may also be employed to control process conditions during precursor delivery and deposition of the film. The control module 900 will typically include one or more memory devices and one or more processors.

The control module 900 may control activities of the precursor delivery system and deposition apparatus. The control module 900 executes computer programs including sets of instructions for controlling process timing, delivery system temperature, and pressure differentials across the filters, valve positions, mixture of gases, chamber pressure, chamber temperature, substrate temperature, RF power levels, substrate chuck or pedestal position, and other parameters of a particular process. The control module 900 may also monitor the pressure differential and automatically switch vapor precursor delivery from one or more paths to one or more other paths. Other computer programs stored on memory devices associated with the control module 900 may be employed in some embodiments.

Typically there will be a user interface associated with the control module 900. The user interface may include a display 918 (e.g., a display screen and/or graphical software displays of the apparatus and/or process conditions), and user input devices 920 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 910, and thermocouples located in delivery system, the pedestal or chuck. Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A method, comprising:
performing a series of process steps on a first plurality of test wafers, each of the first plurality of test wafers forming a plurality of features, wherein a first process step in the series of process steps is performed under a first process condition, wherein the series of process steps includes at least one process step;
performing the series of process steps on a second plurality of test wafers, each of the second plurality of test wafers forming the plurality of features, wherein the first process step is performed under a second process condition;
measuring a first dimension of the plurality of features located on the first plurality of test wafers;
measuring a second dimension of the plurality of features located on the second plurality of test wafers; and
determining a sensitivity factor for the plurality of features relating change in dimension and change in process condition.

2. The method of claim 1, wherein the determining includes:
determining the sensitivity factor based on a difference between the first process condition and the second process condition, and based on a difference between the first dimension and the second dimension.

3. The method of claim 1,
wherein the first process condition is a first temperature of a pedestal configured to support a test wafer, the first process step being an etch process step,
wherein the second process condition is a second temperature of the pedestal.

4. The method of claim 3,
wherein the sensitivity factor is a trim sensitivity factor relating a change in dimension of the plurality of features and a change in temperature of the pedestal when performing an etch process step as the first process step.

5. The method of claim 1,
wherein the first process condition is a first time period for performing an etch process step as the first process step,
wherein the second process condition is a second time period for performing a trim process step.

6. The method of claim 5,
wherein the sensitivity factor is a trim sensitivity factor relating a change in dimension of the plurality of features and a change in time when performing the etch process step.

7. The method of claim 1,
wherein the first process condition is a first temperature of a pedestal configured for wafer support, the first process step being a deposition step,
wherein the second process condition is a second temperature of the pedestal.

8. The method of claim 7,
wherein the sensitivity factor is a deposition sensitivity factor relating a change in dimension of the plurality of features and change in temperature of the pedestal when performing the deposition step.

9. The method of claim 1,
wherein the first process condition is a first number of cycles of a deposition step that is the first process step,
wherein the second process condition is a second number of cycles of the deposition step.

10. The method of claim 9,
wherein the sensitivity factor is a deposition sensitivity factor relating a change in dimension of the plurality of features and a change in a number of atomic layer deposition cycles when performing the deposition step.

11. The method of claim 1, wherein the measuring the first dimension includes:
measuring each of the plurality of features on the first plurality of test wafers to determine a plurality of dimensions; and
determining an average of the plurality of dimensions that is the first dimension.

12. The method of claim 11,
wherein the each of the plurality of features is measured at an end of the series of process steps,
wherein the series of process steps is a self-aligned double patterning (SADP) process,
wherein the first process step is included in a first patterning of the SADP process.

13. The method of claim 11,
wherein the each of the plurality of features is measured at an end of the first process step.

14. The method of claim 1, wherein the measuring the second dimension includes:
measuring each of the plurality of features on the second plurality of test wafers to determine a plurality of dimensions; and
determining an average of the plurality of dimensions that is the second dimension.

15. The method of claim 14,
wherein the each of the plurality of features is measured at an end of the series of process steps,
wherein the series of process steps is a self-aligned double patterning (SADP) process,
wherein the first process step is included in a first patterning of the SADP process.

16. The method of claim 14,
wherein the each of the plurality of features is measured at an end of the first process step.

17. The method of claim 1,
wherein each of the first plurality of test wafers and each of the second plurality of test wafers is a blanket wafer.

18. The method of claim 1,
wherein each of the first plurality of test wafers and each of the second plurality of test wafers is a topographic wafer.

19. A method comprising:
performing a series of process steps on a wafer to obtain a plurality of features, wherein a process step is performed under a process condition;

measuring a dimension of the plurality of features after performing the series of process steps;

determining a difference between the dimension of the plurality of features that is measured and a target dimension for the plurality of features; and modifying the process condition for the process step based on the difference and a sensitivity factor for the plurality of features relating change in dimension and change in process condition, wherein the modifying the process condition includes modifying a temperature of a pedestal configured for wafer support, the temperature used when performing the process step that is an etch process step, wherein the sensitivity factor is a trim sensitivity factor relating a change in the dimension of the plurality of features and a change in temperature of the pedestal when performing the etch process step.

20. The method of claim 19, further comprising:
performing the series of process steps using the process condition that is modified for the process step performed on another wafer.

21. The method of claim 19, wherein the measuring the dimension includes:
measuring each of the plurality of features to determine a plurality of dimensions; and
determining an average of the plurality of dimensions, the average being the dimension.

22. The method of claim 21,
wherein the each of the plurality of features is measured at an end of the series of process steps,
wherein the series of process steps is a self-aligned double patterning (SADP) process,
wherein the process step is included in a first patterning of the SADP process.

23. A method, comprising:
measuring an incoming ADI dimension of a mandrel on a wafer;
determining a difference between the incoming ADI dimension and a desired ADI dimension of the mandrel;
modifying a time for performing an etch process step based on the difference and an etch rate of the etch process step to achieve a desired ADT dimension of a core feature based on the incoming ADI dimension, the core feature being formed when performing a first patterning process of a self-aligned double patterning (SADP) process;
receiving a change in a second patterning process of the SADP process;
determining a modified ASD dimension for an oxide layer over the core feature based on the change in the second patterning process; and
determining a number of deposition cycles when performing an atomic layer deposition (ALD) process to achieve the modified ASD dimension based on a deposition rate of the ALD process and the desired ADT dimension of the core feature.

24. The method of claim 23, further comprising:
performing the number of deposition cycles in the ALD process that is performed within the first patterning process.

25. The method of claim 23,
wherein the change in the second patterning process is a change in a dry etch process.

26. The method of claim 23, wherein the determining the difference includes:
determining that the incoming ADI dimension is larger than the desired ADI dimension.

27. The method of claim 23, wherein the determining the difference includes:
determining that the incoming ADI dimension is smaller than the desired ADI dimension.

28. The method of claim 23, further comprising:
determining the etch rate based on a sensitivity factor relating a change in ADI dimension and change in time to determine the etch rate.

29. The method of claim 23, further comprising:
determining the deposition rate of the ALD process based on a sensitivity factor relating a change in ASD dimension per deposition cycle.

30. A method comprising:
performing a series of process steps on a wafer to obtain a plurality of features, wherein a process step is performed under a process condition;
measuring a dimension of the plurality of features after performing the series of process steps;
determining a difference between the dimension of the plurality of features that is measured and a target dimension for the plurality of features; and
modifying the process condition for the process step based on the difference and a sensitivity factor for the plurality of features relating change in dimension and change in process condition,
wherein the modifying the process condition includes modifying a time for performing the process step that is an etch process step,
wherein the sensitivity factor is a trim sensitivity factor relating a change in the dimension of the plurality of features and a change in time when performing the etch process step.

31. A method comprising:
performing a series of process steps on a wafer to obtain a plurality of features, wherein a process step is performed under a process condition;
measuring a dimension of the plurality of features after performing the series of process steps;
determining a difference between the dimension of the plurality of features that is measured and a target dimension for the plurality of features; and
modifying the process condition for the process step based on the difference and a sensitivity factor for the plurality of features relating change in dimension and change in process condition,
wherein the modifying the process condition includes modifying a temperature of a pedestal configured for wafer support, the temperature used when performing the process step that is a deposition step,
wherein the sensitivity factor is a deposition sensitivity factor relating a change in the dimension of the plurality of features and a change in temperature of the pedestal when performing the deposition step.

32. A method comprising:
performing a series of process steps on a wafer to obtain a plurality of features, wherein a process step is performed under a process condition;
measuring a dimension of the plurality of features after performing the series of process steps;
determining a difference between the dimension of the plurality of features that is measured and a target dimension for the plurality of features; and modifying the process condition for the process step based on the difference and a sensitivity factor for the plurality of features relating change in dimension and change in process condition,
wherein the modifying the process condition includes modifying a number of cycles of a deposition step that is the process step,
wherein the sensitivity factor is a deposition sensitivity factor relating a change in the dimension of the plurality of features and a change in a number of atomic layer deposition cycles when performing the deposition step.

* * * * *